United States Patent [19]

Tanoi

[11] Patent Number: 5,510,746
[45] Date of Patent: Apr. 23, 1996

[54] LOAD CIRCUIT TOLERATING LARGE CURRENT AND VOLTAGE SWINGS

[75] Inventor: Satoru Tanoi, Tokyo, Japan

[73] Assignee: Oki Electric Industry Co., Ltd., Tokyo, Japan

[21] Appl. No.: 457,879

[22] Filed: Jun. 1, 1995

Related U.S. Application Data

[62] Division of Ser. No. 170,070, Dec. 20, 1993.

[30] Foreign Application Priority Data

| Dec. 28, 1992 | [JP] | Japan | 4-349645 |
| Dec. 28, 1992 | [JP] | Japan | 4-349646 |
| Dec. 28, 1992 | [JP] | Japan | 4-359742 |

[51] Int. Cl.[6] .......................... H03K 17/687; H03L 5/00
[52] U.S. Cl. .......................... 327/427; 327/333; 327/375; 327/328
[58] Field of Search .......................... 327/333, 530, 327/427, 434, 435, 493, 108, 109, 580, 581, 375, 579, 309, 313, 328, 327; 365/203

[56] References Cited

U.S. PATENT DOCUMENTS

| 3,660,682 | 5/1972 | Gartner | 327/535 |
| 3,778,698 | 12/1973 | Romano | 327/535 |
| 4,433,527 | 2/1984 | Lewis | 327/538 |
| 4,516,225 | 5/1985 | Frederick | 327/427 |
| 4,716,356 | 12/1987 | Vyne et al. | 327/103 |
| 5,008,565 | 4/1991 | Taylor | 327/581 |
| 5,132,576 | 7/1992 | Park | 327/51 |
| 5,258,669 | 11/1993 | Nakashima | 327/51 |
| 5,302,867 | 4/1994 | Ahn | 327/52 |
| 5,317,218 | 5/1994 | Liu | 327/51 |
| 5,392,243 | 2/1995 | Nakamura | 327/51 |

OTHER PUBLICATIONS

Ramkumar, K. and Nagaj, K., "Novel Schmitt Trigger Based on Lambda Diode," *Electronics Letters*, vol. 20, No. 25/26 (Dec. 6, 1984) pp. 1059–1061.

Temes, G. C. and Ki, W. H., "Fast CMOS Current Amplifier and Buffer Stage," *Electronics Letters*, vol. 23, No. 13 (Jun. 18, 1987) pp. 696–697.

Seevinck, E. et al., "Current–Mode Techniques for High-–Speed VLSI Circuits with Application to Current Sense Amplifier for CMOS SRAM'S," *IEEE*, vol. 26, No. 4 (Apr. 1991) pp. 525–536.

*Primary Examiner*—Toan Tran
*Attorney, Agent, or Firm*—Edward D. Manzo; Ted K. Ringsred

[57] ABSTRACT

A load circuit which can tolerates large current and voltage swings before saturation begins includes a field effect transistor having a source coupled to a power supply, a drain coupled to an input terminal which receives signals from a memory circuit data line, and a gate coupled to the drain through a level shifter.

3 Claims, 30 Drawing Sheets

CIRCUIT A

CIRCUIT B

POTENTIAL AT NODE X ($V_X$)

LOAD CIRCUIT TOLERATING LARGE CURRENT AND VOLTAGE SWINGS

This application is a divisional of co-pending U.S. application Ser. No. 08/170,070, filed on Dec. 20, 1993.

BACKGROUND OF THE INVENTION

This invention relates to an improved sense circuit capable of sensing a small input current signal and producing a large voltage output swing, to a novel negative-resistance circuit, load circuit, level shifter, and amplifier that can be used in the sense circuit, and to a Schmitt trigger employing the negative-resistance circuit.

The well-known advantage of using current signals with small voltage swings in integrated circuits is that these signals can be transmitted quickly over long interconnecting lines. In a read-only memory (ROM), static random-access memory (SRAM), or dynamic random-access memory (DRAM), for example, current signals can be used for rapid transfer of data over data lines. Sense circuits must then convert the data signals from current to voltage form in order to drive transistors, and to enable the memory device to output the data in a standard voltage-signal mode.

A conventional sense circuit of this type comprises the following elements coupled in series between a power-supply terminal and ground: a first resistance, an input terminal, a transistor, an output terminal, and a second resistance. The transistor is controlled by an amplifier that receives input from the output terminal, creating a positive feedback loop. Positive feedback enables a small change in current at the input terminal to produce a large voltage change at the output terminal.

FIG. 1 shows part of a DRAM using this conventional sense circuit. The symbols $V_{CC}$ and GND indicate the power-supply potential and ground, respectively.

The switching circuit 1 is one of a large number of similar switching circuits coupled to a data line DL, which feeds the input terminal IN of a sense circuit 2. The output terminal OUT of the sense circuit 2 is coupled to a next-stage differential voltage amplifier (not shown in the drawing).

The switching circuit 1 comprises n-channel metal-oxide-semiconductor field-effect transistors (hereinafter, N-MOSFETs) 1a and 1b coupled in series between data line DL and ground. The gate of N-MOSFET 1a is coupled to a column select line CL; the gate of N-MOSFET 1b is coupled to a bit line BL.

The sense circuit 2 has been divided for explanatory purposes into three blocks: a data-line load circuit 3, a current-to-voltage converter 4, and an inverting amplifier 5. In the load circuit 3, a p-channel metal-oxide-semiconductor field-effect transistor (hereinafter, P-MOSFET) 3a with its gate coupled to ground provides a load resistance between $V_{CC}$ and the input terminal IN. In the current-to-voltage converter 4, a P-MOSFET 4a and N-MOSFET 4b are coupled in series between the input terminal IN and ground. The drain of P-MOSFET 4a, the drain and gate of N-MOSFET 4b, and the output terminal OUT are coupled at a node $N_1$. The N-MOSFET 4b provides a current-sensing resistance between node $N_1$ and ground. The gate Of P-MOSFET 4a is coupled to a node $N_2$.

The inverting amplifier 5 has an input node $A_{in}$ coupled to node $N_1$ and an output node $A_{out}$ coupled to node $N_2$, and comprises a P-MOSFET 5a and N-MOSFET 5b coupled in series between $V_{CC}$ and ground. The gate and drain of P-MOSFET 5a are coupled to the output node $A_{out}$. The drain of N-MOSFET 5b is coupled to the output node $A_{out}$, and its gate is coupled to the input node $A_{in}$.

During normal operation, the data line DL is biased to a potential near $V_{CC}$, the potential being controlled by the current flow through the load P-MOSFET 3a. A certain bias current I flows from $V_{CC}$ through the load circuit 3 to the current-to-voltage converter 4. Little or no current flows between the load circuit 3 and data line DL.

If read access results in activation of CL and BL, turning on transistors 1a and 1b in the switching circuit 1, then some of this bias current I is diverted from the current-to-voltage converter 4 to the data line DL. The resulting reduction $-\Delta I$ in current flow through the current-to-voltage converter 4 reduces the potential at node $N_1$, so the potential at the input terminal $A_{in}$ of the inverting amplifier 5 falls. The potential at the output terminal $A_{out}$ (node $N_2$) therefore rises, reducing the conductance of P-MOSFET 4a. Current flow through the current-to-voltage converter 4 is thereby reduced still further, setting up positive feedback that quickly produces a large voltage swing at the output terminal OUT.

The reduction in current flow through the current-to-voltage converter 4 is partly balanced by the increased current flow on the data line DL, so the change in the current flowing through the load circuit 3 is small. The change in potential at the input terminal IN is therefore slight; the voltage swing on the data line DL is kept small. Ideally, the current increase $\Delta I$ on the data line DL equals the current decrease $-\Delta I$ in the current-to-voltage converter 4, as shown in FIG. 1, in which case a large output voltage swing is obtained with no voltage swing on the data line LD.

The conventional sense circuit 2, however, is not ideal. It has problems from the standpoints of both design and operation, as discussed next.

One problem arises from the similarity between the left side of the circuit, comprising the load 3 and current-to-voltage converter 4 and denoted as circuit A in FIG. 1, and the right side, comprising the inverting amplifier 5 and denoted as circuit B.

Circuit B has $A_{in}$ as its input and $A_{out}$ as its output. The input-output characteristic of circuit B is such that the potential at $A_{out}$ falls when the potential at $A_{in}$ rises, and the potential at $A_{out}$ rises when the potential at $A_{in}$ falls.

Circuit A can be viewed as having node $N_2$ as its input and node $N_1$ as its output. Circuit A then has a similar input-output characteristic: the potential at node $N_1$ falls when the potential at node $N_2$ rises, and rises when the potential at node $N_2$ falls.

Circuit A and circuit B are cross-coupled: the input node of each is coupled to the output node of the other. They therefore operate at a point where their input-output characteristics intersect, but due to the similarity of their characteristics, the point of intersection may not be uniquely defined. This can cause the sense circuit 2 to oscillate between two operating points.

The cross-coupled configuration in FIG. 1 is furthermore similar to the configuration of a latch comprising two inverters coupled in a loop. The sense circuit 2 has a corresponding tendency to latch up, remaining in the high or low output state regardless of changes in current at the input terminal IN.

Another problem is that a large output voltage swing at the output terminal OUT entails a large swing at the input node $A_{in}$ of the inverting amplifier 5, hence at its output node $A_{out}$, increasing the gain of the positive-feedback loop. The output voltage swing accordingly cannot be designed independently of the loop gain; the one depends on the other.

A further problem with the conventional sense circuit 2 becomes evident when it is used in a DRAM having a page mode, in which a word line remains active while memory cells in different columns on that word line are accessed. During such page access, at first the voltage swings on the bit lines are small, and only slight changes occurs in the current flowing on the data line DL. As access to the same word line continues, however, the voltage swings on the bit lines increase, with corresponding larger changes in current flow on the data line DL. If the load P-MOSFET 3a is designed for reliable sensing of small current changes on data line DL, then when the current changes become larger, P-MOSFET 3a may begin to saturate, allowing unwanted large potential changes on data line DL. That is, the sense circuit 2 has inadequate dynamic range for page-mode operation in a DRAM.

The dynamic range can be widened by using an N-MOSFET with interconnected gate and drain as the load transistor. If this type of load is employed, however, it becomes impossible to bias the data line DL close to $V_{CC}$. This leads to problems regarding operating speed and operating margin, particularly at low supply voltages.

SUMMARY OF THE INVENTION

One object of the present invention is accordingly to provide a sense circuit suitable for operation at low supply voltages.

Another object is to provide a sense circuit with stable operation.

Yet another object is to provide a sense circuit with a wide dynamic range.

Still another object is to provide a sense circuit with high gain.

Yet another object is to provide a sense circuit with a simple configuration.

Still another object is to provide a sense circuit that can be easily fabricated.

Yet another object is to provide a sense circuit with independently designable loop gain and output swing.

Still another object is to provide a memory circuit incorporating a sense circuit that achieves the above objects.

Other objects are to provide a data-line load circuit, level shifter, amplifier circuit, and negative-resistance circuit that are useful for configuring a sense circuit to achieve the above objects, as well as for other purposes.

An additional object is to provide a Schmitt trigger with low power dissipation.

According to a first aspect of the invention, a first fixed potential (e.g. $V_{CC}$) is supplied through a load circuit to an input terminal, thereby producing an input potential at the input terminal responsive to current flow through the load circuit. This input potential controls the gate of a field-effect transistor coupled between the input terminal and an output terminal. For example, an inverting amplifier is coupled between the input terminal and the gate of the transistor. The output terminal is coupled through a resistance circuit to a second fixed potential (e.g. ground).

According to a second aspect of the invention, there are two input terminals, each with a load circuit as described above, and two output terminals, each with a resistance circuit as described above. A first depletion-mode field-effect transistor is coupled between the first input terminal and first output terminal, its gate coupled to the second input terminal. A second depletion-mode field-effect transistor is coupled between the second input terminal and second output terminal, its gate coupled to the first input terminal.

According to a third aspect of the invention, instead of depletion-mode field-effect transistors, a first negative-resistance circuit is coupled between the first input and output terminals, and a second negative-resistance circuit between the second input and output terminals. Each negative-resistance circuit has a control terminal that controls its conductance. The control terminal of the first negative-resistance circuit is coupled to the second input terminal. The control terminal of the second negative-resistance circuit is coupled to the first input terminal.

According to a fourth aspect of the invention, the first and second input terminals mentioned in the second and third aspects are coupled to data lines in a memory circuit.

According to a fifth aspect of the invention, the negative-resistance circuits mentioned in the second and third aspects comprise a first field-effect transistor of a first channel type coupled between a pair of input/output terminals, and second and third field-effect transistors of a second channel type coupled between two fixed potentials. The gate of the first field-effect transistor is coupled to a node between the second and third field-effect transistors. The gate of the second field-effect transistor is coupled to the control terminal. The gate of the third field-effect transistor is coupled to one of the input/output terminals.

According to a sixth aspect of the invention, a Schmitt trigger comprises the negative-resistance circuit of the fifth aspect and a fourth field-effect transistor, of the second channel type, coupled in series between two fixed potentials. The control terminal of the negative-resistance circuit and the gate of the fourth field-effect transistor are both coupled to an input terminal. Output is obtained from a node between the negative-resistance circuit and the fourth field-effect transistor.

According to a seventh aspect of the invention, a load circuit comprises a field-effect transistor with its source coupled to receive a fixed potential, its drain coupled to an input terminal, and its gate coupled through a level shifter to the same input terminal.

According to an eighth aspect of the invention, a level shifter comprises a depletion-mode field-effect transistor of a first channel type with its source coupled to a fixed potential and its gate to an input terminal; and an enhance-mode field-effect transistor of a second channel type with its source coupled to an output terminal, its gate coupled to the input terminal, and its drain coupled to the fixed potential. A current mirror controls current flow through the enhancement-mode field-effect transistor responsive to current flow through the depletion-mode field-effect transistor.

According to a ninth aspect of the invention, an inverting amplifier comprises an input node, an output node, a negative-resistance circuit that provides a variable negative resistance between the output node and a first fixed potential, responsive to the potential of the input node, and a resistance circuit coupled between the output node and a second fixed potential.

DETAILED DESCRIPTION OF THE INVENTION

Embodiments of the invention will be described with reference to the attached illustrative drawings. These drawings do not restrict the scope of the invention, which should be determined solely from the appended claims.

In the discussions of circuit characteristics, it will be assumed unless otherwise stated that N-MOSFETs are formed in a grounded substrate, and P-MOSFETs in a substrate biased at $V_{CC}$, as is customary in complementary metal-oxide-semiconductor (CMOS) circuits. All transistors will be enhancement-mode MOSFETs unless otherwise noted.

$V_{TNN}$ will denote the threshold gate-source voltage of an N-MOSFET with arbitrary source potential; $V_{TN}$ will denote the threshold gate-source voltage when the source is grounded. Assuming a grounded substrate, if the source potential is higher than ground, then $V_{TNN} > V_{TN}$.

Similarly, $V_{TPP}$ will denote the (negative) threshold gate-source voltage of a P-MOSFET with arbitrary source potential, and $V_{TP}$ the threshold gate-source voltage when the source is coupled to $V_{CC}$. Assuming a substrate biased at $V_{CC}$, if the source potential is less than $V_{CC}$, then $|V_{TPP}| > |V_{TP}|$.

In CMOS circuits $V_{TN}$ and $|V_{TP}|$ are usually substantially equal. This also will be assumed.

1st Embodiment

Figure 2:
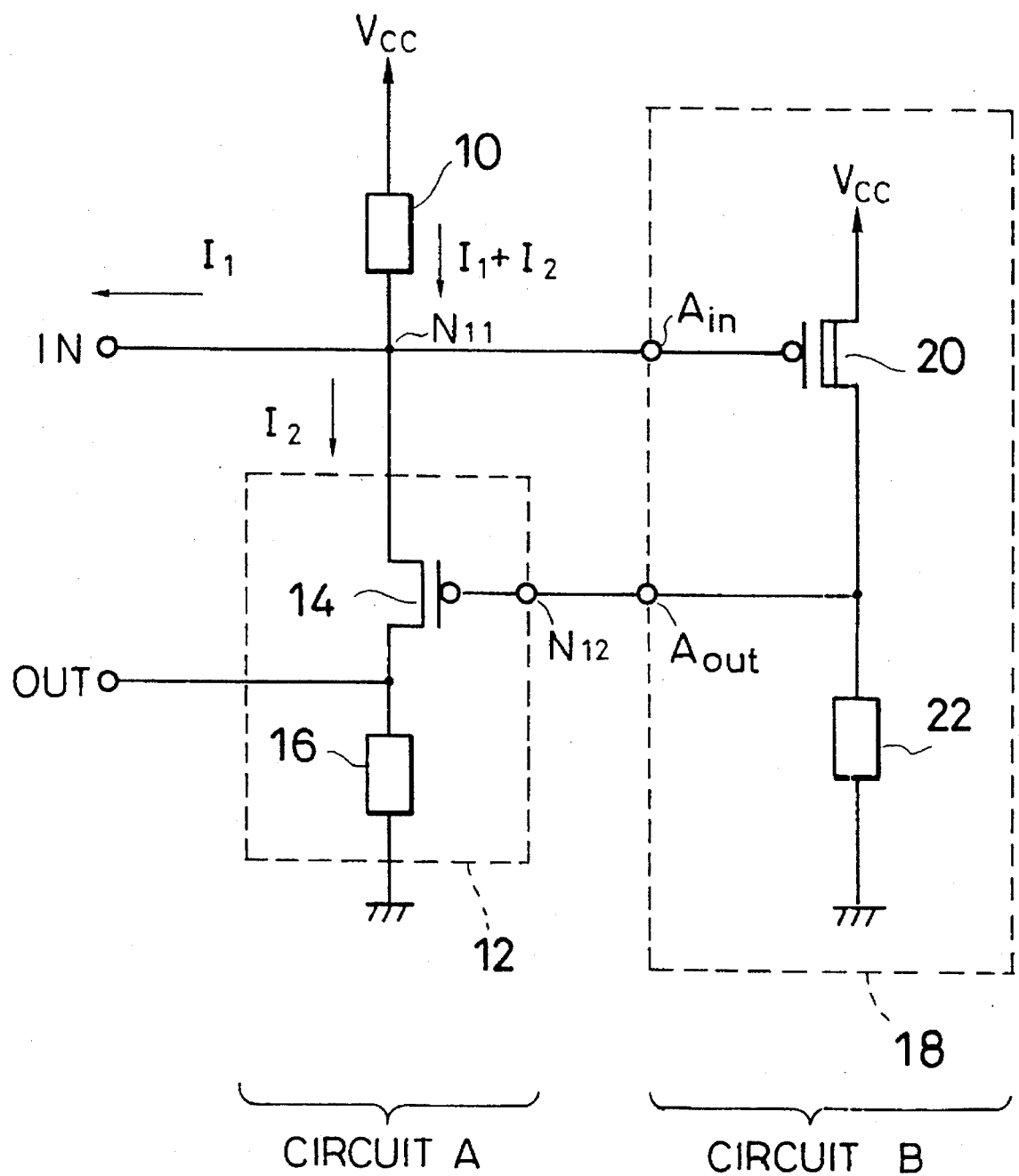
FIG. 2 is a schematic diagram of a first novel sense circuit.

FIG. 2 shows a sense circuit illustrating a first embodiment of the invention.

The input terminal IN of this sense circuit is coupled to a node $N_{11}$. A resistive load circuit 10 is coupled between node $N_{11}$ and $V_{CC}$. A current-to-voltage converter 12 is coupled between node $N_{11}$ and ground. The current-to-voltage converter 12 comprises a P-MOSFET 14 and a resistance circuit 16 coupled in series. The source of P-MOSFET 14 is coupled to node $N_{11}$, its gate is coupled to a node $N_{12}$, and its drain is coupled to one end of the resistance circuit 16 and to the output terminal OUT of the sense circuit. The other end of the resistance circuit 16 is coupled to ground.

Nodes $N_{11}$ and $N_{12}$ are coupled to the input node $A_{in}$ and output node $A_{out}$, respectively, of an inverting amplifier 18. The inverting amplifier 18 comprises a depletion-mode P-MOSFET 20 coupled in series with a resistance circuit 22. The source of the depletion-mode P-MOSFET 20 is coupled to $V_{CC}$, its gate is coupled to the input node $A_{in}$, and its drain is coupled to one end of the resistance circuit 22 and to the output node $A_{out}$. The other end of the resistance circuit 22 is coupled to ground.

Next the operation of this sense circuit will be described.

Depending on other external circuits (not shown) to which the sense circuit is connected, under normal conditions a small (possibly zero) bias current $I_1$ will flow in or out at the input terminal IN. In the drawing, the input terminal IN is considered to be a current source with respect to external circuits, $I_1$ flowing outward. If the flow is actually inward, then $I_1$ is negative.

The sense circuit and its connected circuits are preferably designed so that under normal conditions, input terminal IN is biased at a potential close to $V_{CC}$. This can be done, for example, by providing P-MOSFET 14 and resistance circuit 16 with sufficiently high resistance values.

A second bias current $I_2$ flows from the data-line load circuit 10 to the current-to-voltage converter 12. P-MOSFET 14 is designed to saturate under normal operating conditions, making $I_2$ dependent on the gate-source voltage rather than the drain-source voltage of P-MOSFET 14. The potential of the input terminal IN depends on the total current flow $(I_1+I_2)$ through the load circuit 10.

Suppose now that a current signal is received at input terminal IN, causing the current $I_1$ to increase by $\Delta I_1$. The increased current produces a greater voltage drop across the load circuit 10, so the potential of input terminal IN (and of node $N_{11}$) decreases slightly. This decrease is inverted and amplified by the inverting amplifier 18, raising the level of node $N_{12}$. Since the source potential of P-MOSFET 14 has fallen and its gate potential has risen, its gate-source voltage is reduced in absolute value.

The reduced gate-source voltage produces a corresponding reduction in the conductance of P-MOSFET 14. The current $I_2$ flowing through the current-to-voltage converter 12 decreases by an amount $\Delta I_2$. The result is a potential change of $-\Delta I_2 \cdot R$ at output terminal OUT, where R is the resistance value of the resistance circuit 16. A desired output voltage swing can be obtained by suitable selection of R.

The sense circuit can be designed so that $\Delta I_1$ and $\Delta I_2$ are substantially equal, in which case the net change in current flow through the load circuit 10 is approximately zero. The potential of input terminal IN then remains substantially fixed. An output signal with a large voltage swing can accordingly be obtained from an input current signal while causing only a slight voltage swing at the input terminal IN.

This sense circuit is well suited for use at a low supply voltage $V_{CC}$. One reason is that the depletion-mode P-MOSFET 20 conducts even when its gate potential is $V_{CC}$. This enables the input terminal IN to be biased at a level arbitrarily close to $V_{CC}$ without forcing the inverting amplifier 18 into cut-off. A potential close to $V_{CC}$ can therefore be applied to the current-to-voltage converter 12, providing adequate operating speed and margin even if $V_{CC}$ is low.

Because the input node $A_{in}$ of the inverting amplifier 18 is coupled to the input terminal IN instead of the output terminal OUT, the invented sense circuit also excels in stability of operation. In particular, it has no positive feedback loops, hence no tendency to latch up. Feedback exists between nodes $N_{11}$ and $N_{12}$, but this feedback loop is negative; it tends to steady the potentials of these nodes. Further details will be shown in FIG. 4.

The circuit parameters are also easy to design. To adjust the output voltage swing, it suffices to adjust the resistance value of the resistance circuit 16. To adjust the loop gain between nodes $N_{11}$ and $N_{12}$, it suffices to adjust the gain of the inverting amplifier 18, or adjust the saturation of P-MOSFET 14 by altering the bias potential of its gate. A particular advantage is that the loop gain and output voltage swing can be adjusted independently.

2nd Embodiment

Figure 3:
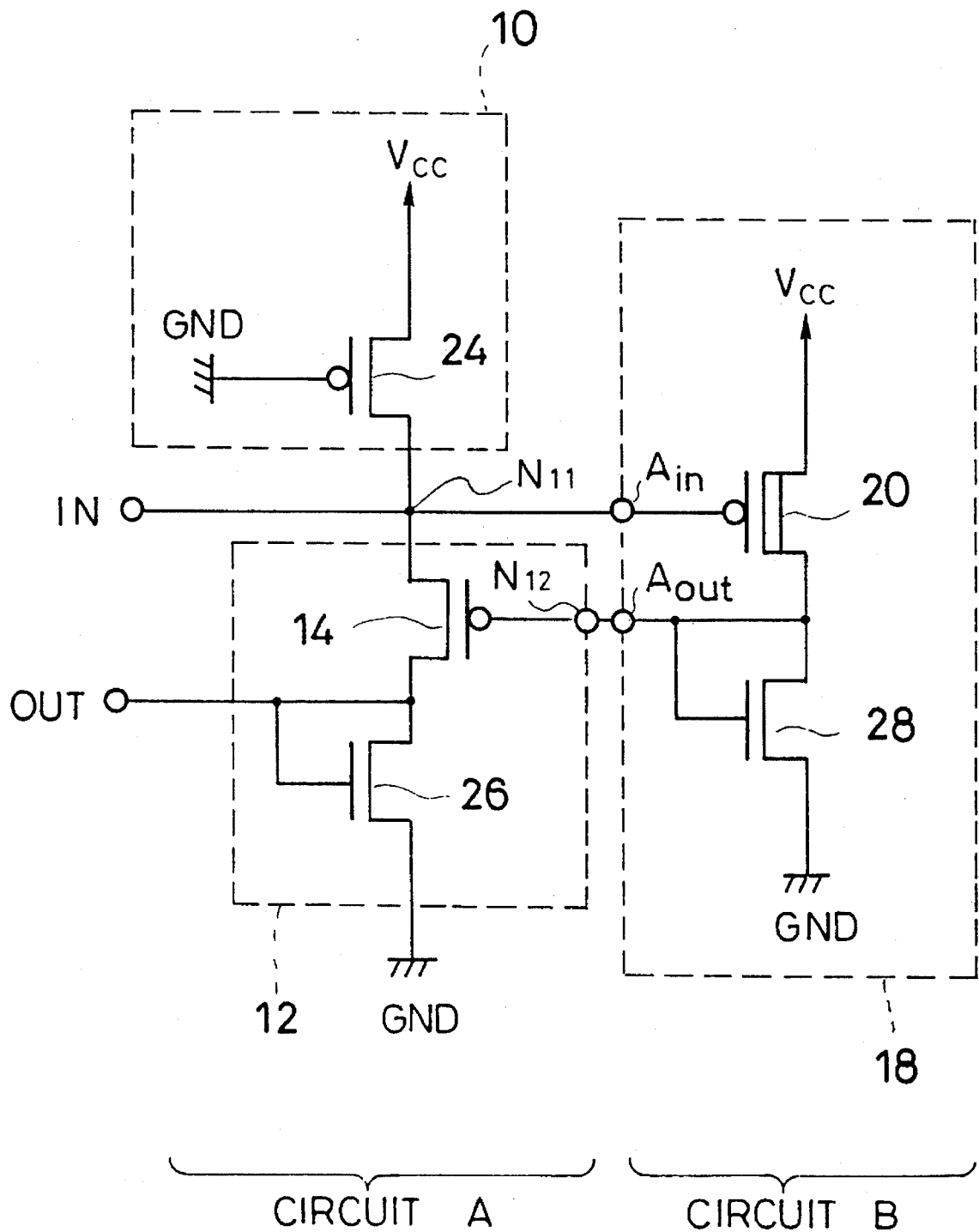
FIG. 3 is a schematic diagram of a second novel sense circuit.

This embodiment, shown in FIG. 3, is a more specific implementation of the first embodiment. The load circuit 10 now comprises a P-MOSFET 24 with grounded gate. The resistance circuit in the current-to-voltage converter 12 comprises an N-MOSFET 26 with interconnected gate and drain. The resistance circuit in the inverting amplifier 18 comprises an N-MOSFET 28 with interconnected gate and drain. Otherwise, the configuration is the same as in FIG. 2, and the same reference numerals are employed.

An advantage of the circuit configuration of FIG. 3 is that use of the N-MOSFET 28 with interconnected gate and drain as the resistance element in the inverting amplifier 18 restricts the voltage swing at the amplifier output node $A_{out}$. This reduces the loop gain, but provides a wider dynamic range, enabling greater potential fluctuations to be tolerated at the input terminal IN while keeping P-MOSFET 14 in saturation.

Since the second embodiment is an instance of the first embodiment, it inherits the advantages noted in the first embodiment: suitability for use at low supply voltages, independent adjustability of the output voltage swing and loop gain, and stability of operation. Stability will now be described in more detail.

In FIGS. 2 and 3, the sense circuit can be divided into a circuit A, consisting of the load circuit 10 and current-to-voltage converter 12, and a circuit B, consisting of the inverting amplifier 18. Circuit A can be regarded as having node $N_{11}$ as its input and node $N_{12}$ as its output, while circuit B has $A_{in}$ as its input and $A_{out}$ as its output. Circuits A and B are mutually cross-coupled; the input of each is coupled to the output of the other.

Figure 4:
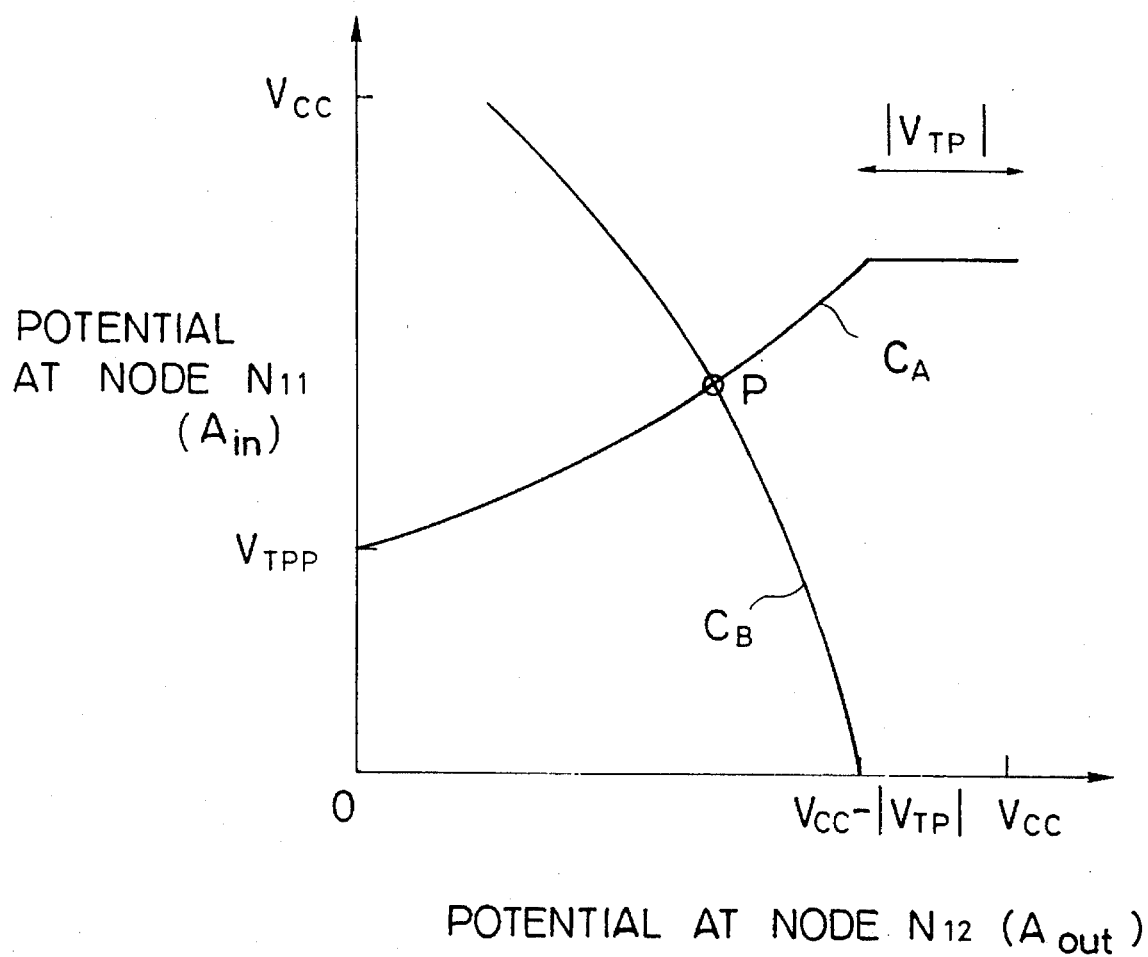
FIG. 4 illustrates input-output characteristics of circuit A and circuit B in FIGS. 2 and 3.

FIG. 4 is a diagram of the input-output voltage characteristics of circuits A and B. The horizontal axis indicates the potential of node $N_{12}$ ($A_{out}$), which is the input node of circuit A and the output node of circuit B. The vertical axis indicates the potential of node $N_{11}$ ($A_{in}$), which is the output node of circuit A and the input node of circuit B. Curve $C_A$ is the input-output characteristic of circuit A; curve $C_B$ is the input-output characteristic of circuit B.

Circuit A operates as a source-follower: as its input potential at node $N_{12}$ rises, its output potential at node $N_{11}$ also rises. Circuit B is an inverting amplifier: as its input potential at node $A_{in}$ rises, its output potential at node $A_{out}$ V falls. Accordingly, characteristic curves $C_A$ and $C_B$ are oriented in substantially perpendicular directions and intersect at a single operating point P. Since only a single operating point P exists, an extremely stable circuit is obtained, with no tendency to oscillate.

3rd Embodiment

Figure 5:
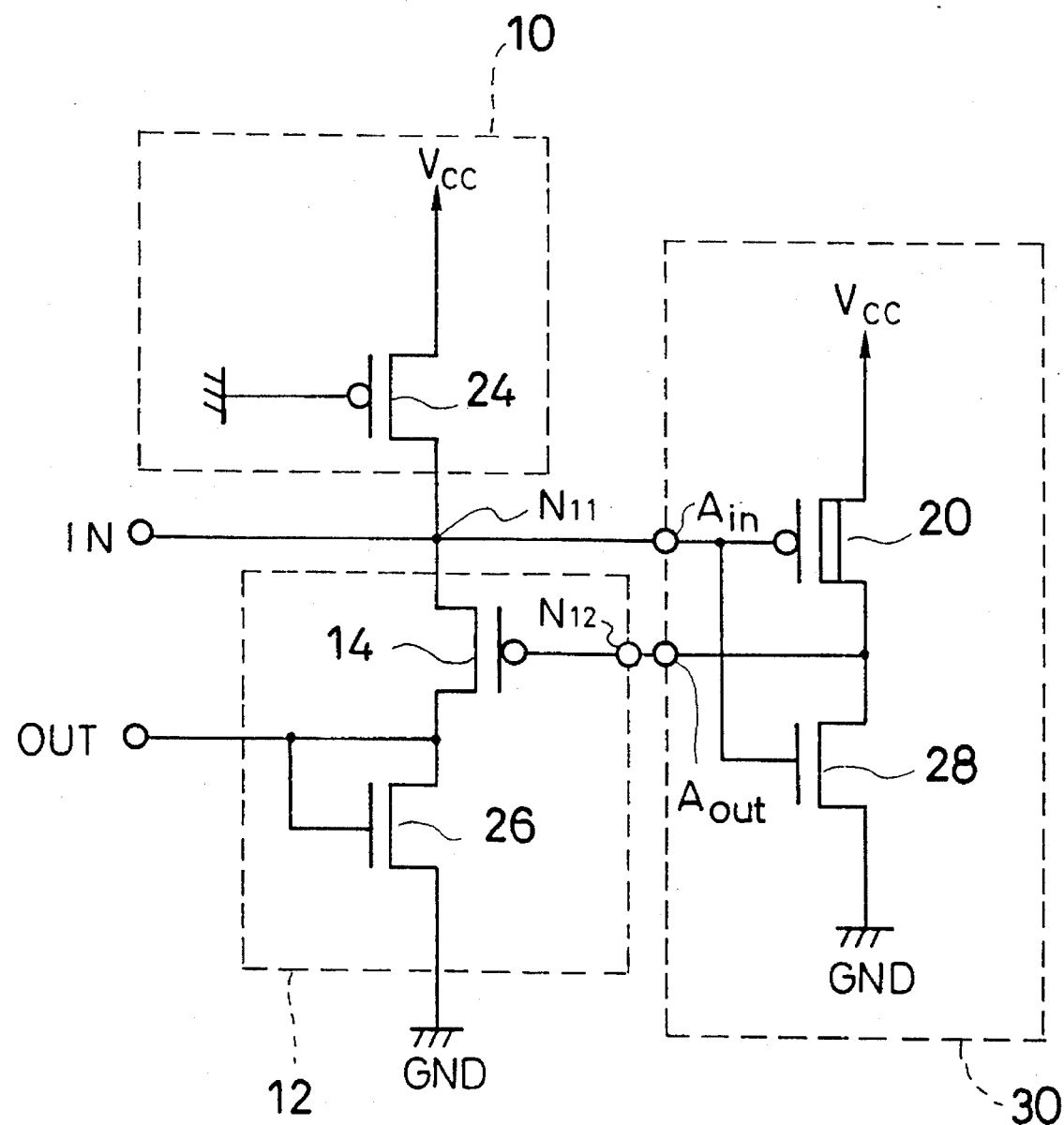
FIG. 5 is a schematic diagram of a third novel sense circuit.

This embodiment, shown in FIG. 5, is another implementation of the first embodiment, and is identical to the second embodiment except for the configuration of the inverting amplifier 30. Elements common to FIGS. 2 and 3 have the same reference numerals.

The inverting amplifier 30 in FIG. 5 differs from the inverting amplifier 18 in FIG. 3 in that the gate of N-MOSFET 28 is coupled to input node $A_{in}$, instead of to the drain of N-MOSFET 28. Otherwise, the circuit configuration is the same as FIG. 3.

By coupling the gate of N-MOSFET 28 to the amplifier input node $A_{in}$, this embodiment increases the gain of the inverting amplifier 30. The loop gain of the sense circuit is therefore improved, although its dynamic range is somewhat narrowed. This embodiment is basically similar in operation to the first and second embodiments, and provides similar advantages, so further details will be omitted.

4th Embodiment

Figure 6:
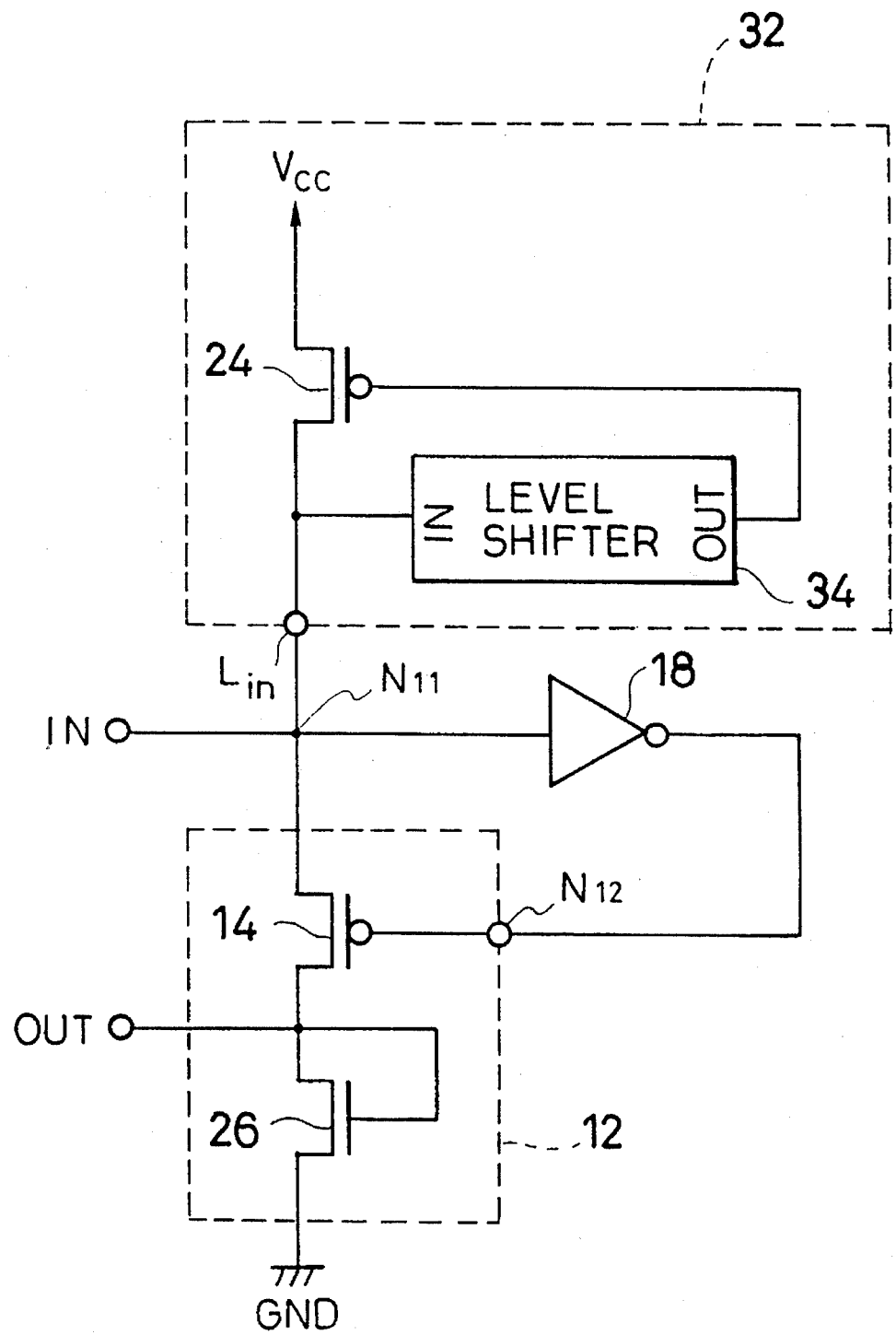
FIG. 6 is a schematic diagram of a fourth novel sense circuit.

This embodiment is illustrated in FIG. 6. Elements common to FIGS. 2, 3, and 5 have the same reference numerals.

This sense circuit comprises a novel load circuit 32, and the same current-to-voltage converter 12 and inverting amplifier 18 (now indicated by a single symbol) as in FIG. 2. Its basic operation is the same as in the first three embodiments. A description of the identical circuit elements and the basic operation will be omitted in order to concentrate on the characteristics of the load circuit 32.

The load circuit 32 comprises a P-MOSFET 24 coupled between $V_{CC}$ and a load input node $L_{in}$, which is coupled to node $N_{11}$. The gate of P-MOSFET 24 is coupled through a level shifter 34 to the same node $L_{in}$. The level shifter 34 receives an input potential from node $L_{in}$, shifts this potential downward by an amount $V_{SHF}$, and provides the down-shifted potential as output to the gate of P-MOSFET 24. The absolute value $|V_{SHF}|$ of the shift should be greater than $|V_{TP}|$, so that the input terminal IN and node $L_{in}$ can be biased close to $V_{CC}$ without cutting off current flow through P-MOSFET 24.

When the input potential is $|V_{SHF}|$, the output potential of the level shifter is substantially zero volts. Beyond this point the output potential remains substantially constant, because the level shifter 34 cannot generate output potentials below the ground potential.

Figure 7:
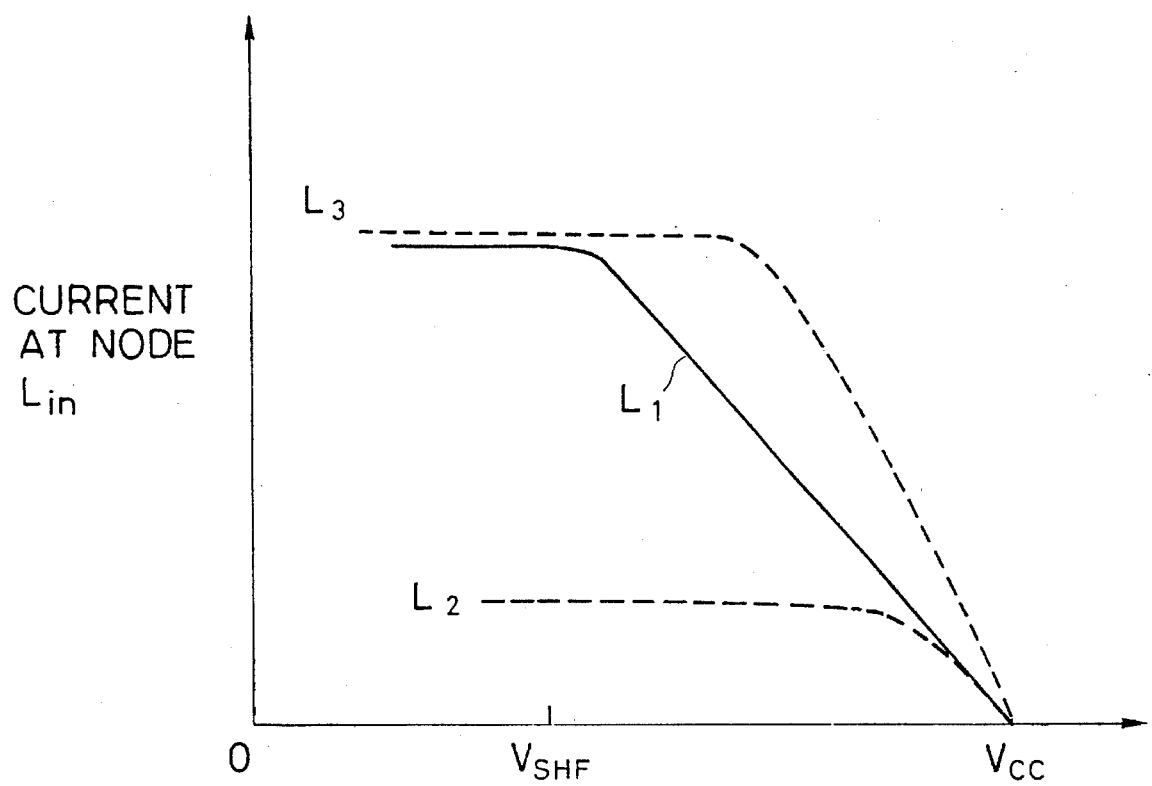
FIG. 7 illustrates the load curve of the load circuit in FIG. 6.

FIG. 7 shows the volt-ampere load curve of the load circuit 32. The horizontal axis in indicates the potential of input node $L_{in}$, denoted $V_{LIN}$; the vertical axis indicates current flowing through P-MOSFET 24 from $V_{CC}$ to node $L_{in}$. The solid curve $L_1$ is the actual load curve of the load circuit 32. The dotted curves $L_2$ and $L_3$ are added for explanation: curve $L_2$ is the load curve if the gate potential $V_G$ of P-MOSFET 24 is held at its maximum attainable value of $V_{CC}-V_{SHF}$; curve $L_3$ is the load curve if the gate of P-MOSFET 24 is grounded ($V_G=0$ V). Curve $L_3$ is therefore the load curve of the load circuit 10 in FIGS. 3 and 5.

Around $V_{LIN}=V_{CC}$, the gate potential $V_G$ of P-MOSFET 24 is near $V_{CC}-V_{SHF}$, and curve $L_1$ is close to curve $L_2$. At a point where $V_{LIN}=V_{SHF}$, since $V_G=0$, curve $L_1$ merges with curve $L_3$. Between these two values, curve $L_1$ is substantially linear, it can be seen that curve $L_1$ remains linear down to smaller values of $V_{LIN}$ than does curve $L_2$. As a whole, the load circuit 32 behaves like a P-MOSFET with an expanded triode region and a reduced saturation region.

Figure 1:
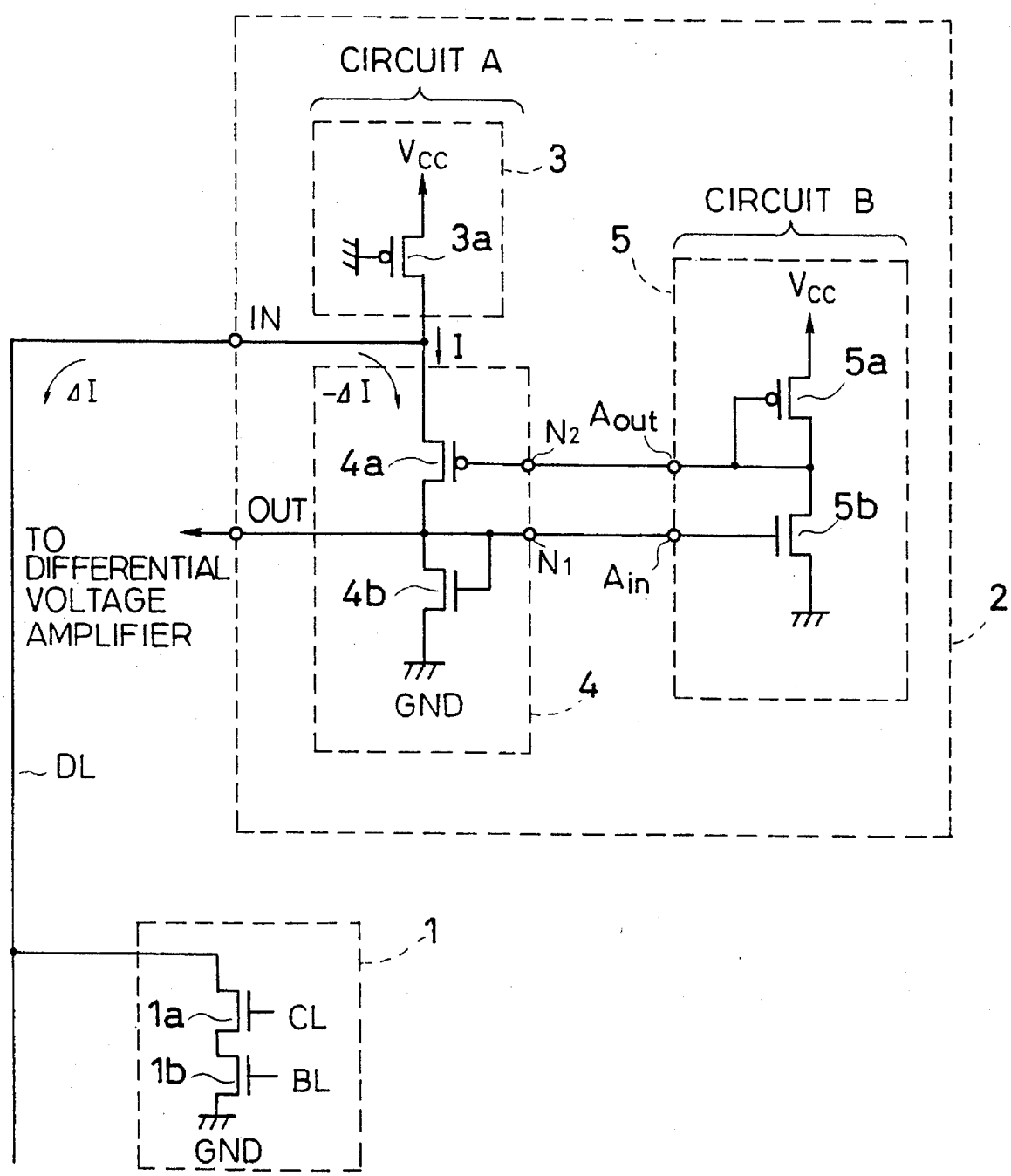
FIG. 1 is a schematic diagram of a conventional sense circuit.

Compared with the load circuit 10 in FIGS. 3 and 5, and with the prior art shown in FIG. 1, if all these load circuits are designed to begin saturating at equal current values, the load circuit 32 of the fourth embodiment has a higher equivalent resistance value. That is, given the same maximum allowable current swing, the circuit in FIG. 6 can sense small current signals more reliably. Alternative, for a given equivalent resistance value, the load circuit 32 in FIG. 6 can tolerate greater current and voltage swings before saturation of characteristics begins. In short, the fourth embodiment has a wider dynamic range.

The load circuit 32 in FIG. 6 is applicable not only to sense circuits; it is also effective when used as a load in various other circuits that require volt-ampere characteristics with improved linearity.

5th Embodiment

Figure 8:
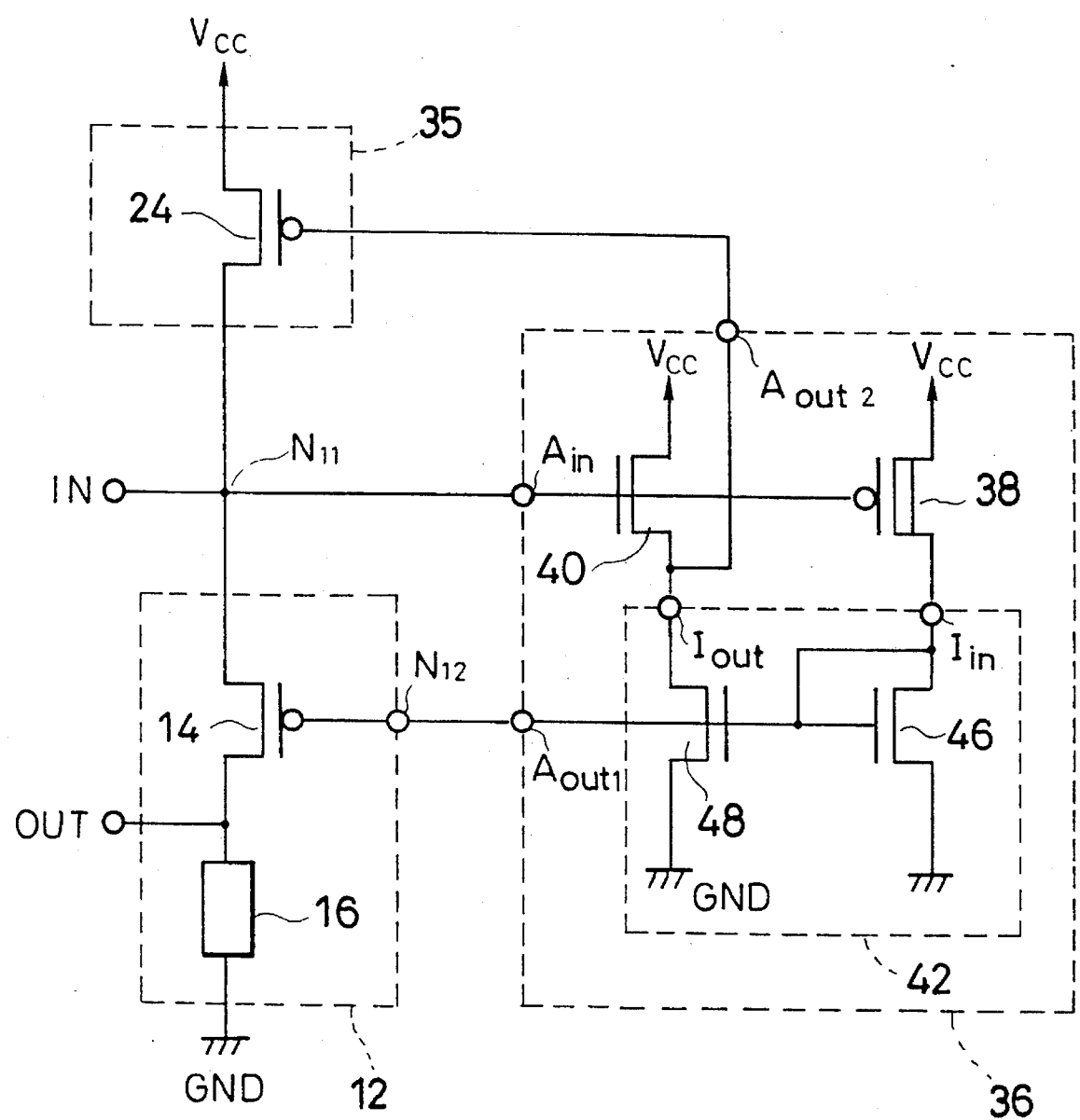
FIG. 8 is a schematic diagram of a fifth novel sense circuit.

This embodiment, shown in FIG. 8, is similar to the fourth embodiment, except that the level shifter is now disposed in the amplifier circuit. Elements common to FIGS. 2, 3, 5, and 6 have the same reference numerals.

This sense circuit comprises a load circuit 35 with a P-MOSFET 24, a current-to-voltage converter 12 as in FIG. 2, and an amplifier circuit 36. The amplifier circuit 36 has an input node $A_{in}$ coupled to the input terminal IN, a first output node $A_{out1}$ coupled to the gate of P-MOSFET 14, and a second output node $A_{out2}$ coupled to the gate of P-MOSFET 24.

This amplifier circuit 36 implements the level shifter 34 and inverting amplifier 18 of FIG. 6 in a single circuit, comprising a depletion-mode P-MOSFET 38 with gate coupled to input node $A_{in}$, an N-MOSFET 40 with gate likewise coupled to input node $A_{in}$, and a current mirror 42 consisting of N-MOSFETs 46 and 48. The source of the depletion-mode P-MOSFET 38 is coupled to $V_{CC}$. Its drain is coupled to a current input node $I_{in}$ of the current mirror 42, and to the first output node $A_{out1}$. The drain of N-MOSFET 40 is coupled to $V_{CC}$, and its source is coupled to a current output node $I_{out}$ of the current mirror 42 and to the second output node $A_{out2}$.

The sources of the N-MOSFETs 46 and 48 in the current mirror 42 are coupled to ground. Their gates are coupled to the first output node $A_{out1}$, and to the current input node $I_{in}$. The drain of N-MOSFET 46 is coupled to the current input node $I_{in}$. The drain of N-MOSFET 48 is coupled to the current output node $I_{out}$. N-MOSFETs 46 and 48 are designed to saturate when the input potential at input node $A_{in}$ is near $V_{CC}$, so that current flow through them is controlled by their gate potential.

Descriptions will next be given of (1) the output potential at the first output node $A_{out1}$, (2) the output potential at the second output node $A_{out2}$, and (3) the operation and advantages of this sense circuit.

(1) Output potential at $A_{out1}$

An inverting amplifier comprising the depletion-mode P-MOSFET 38 and N-MOSFET 46 is coupled between input node $A_{in}$ and the first output node $A_{out1}$. This part has the same structure as the inverting amplifier 18 in FIG. 3. The potential at input node $A_{in}$ (the potential at input terminal IN) is inverted, amplified, and output to output node $A_{out1}$.

(2) Output potential at $A_{out2}$

Figure 9:
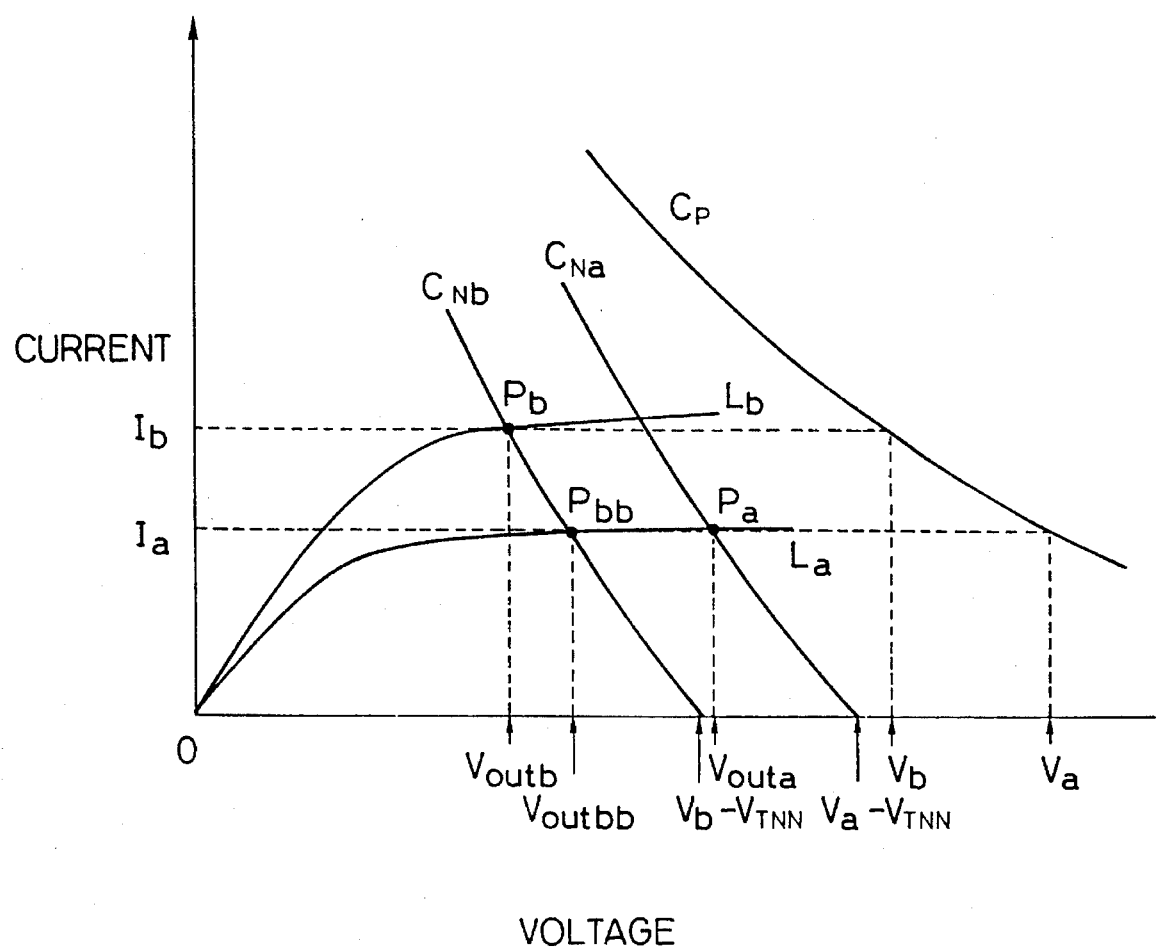
FIG. 9 illustrates volt-ampere characteristics of various transistors in FIG. 8.

FIG. 9 is a volt-ampere diagram for describing the operation of output node $A_{out2}$ in FIG. 8. Current is indicated on the vertical axis and voltage on the horizontal axis. It is assumed that N-MOSFETs 46 and 48 in the current mirror 42 have equal current-driving capabilities.

Curves $C_{Na}$ and $C_{Nb}$ are volt-ampere characteristics of the N-MOSFET 40 when its gate is biased at two potentials $V_a$ and $V_b$, with $V_a>V_b$. $V_a$ and $V_b$ are potentials of input node $A_{in}$. For these two curves, the horizontal axis represents the source potential of N-MOSFET 40 (the potential of output node $A_{out2}$). On curve $C_{Na}$, current begins to flow when the source potential of N-MOSFET 40 is $V_a-V_{TNN}$, and the current increases as this potential decreases. Current flow on curve $C_{Nb}$ begins when the source potential of N-MOSFET 40 is $V_b-V_{TNN}$.

Curves $L_a$ and $L_b$ are corresponding volt-ampere characteristics of N-MOSFET 48 when the potential of input node $A_{in}$ is $V_a$ and $V_b$, respectively. For these two curves also, the horizontal axis represents the potential of output node $A_{out2}$. As the potential at $A_{in}$ rises, the gate potential of N-MOSFET 48 falls, so curve $L_a$ shows less current flow than curve $L_b$.

Curve $C_b$ is the volt-ampere characteristic of P-MOSFET 38. For this curve, the horizontal axis represents the potential of input node $A_{in}$, e.g. $V_a$ or $V_b$.

On the vertical axis, $I_a$ is the current flowing through P-MOSFET 38 when the potential of input node $A_{in}$ is $V_a$. This current $I_a$ must also flow through N-MOSFET 46 and, since N-MOSFETs 46 and 48 constitute a current mirror 42, through N-MOSFET 48. The characteristic curve $L_a$ of N-MOSFET 48 and the characteristic curve $C_{Na}$ of N-MOSFET 40 must therefore intersect at a point $P_a$ where the current value is $I_a$. This point $P_a$ is the operating point of output node $A_{out2}$ when the potential of input node $A_{in}$ is $V_a$. The voltage value $V_{outa}$ of the operating point $P_a$ is the potential of the output node $A_{out2}$.

Similarly, $I_b$ is the current flowing through P-MOSFET 38 when the potential of input node $A_{in}$ is $V_b$. Curves $L_b$ and $C_{Nb}$ must intersect at a point $P_b$ where the current value is $I_b$, and the voltage value $V_{outb}$ of this point $P_b$ becomes the potential of the output node $A_{out2}$.

From FIG. 9 it can be seen that the input voltage at $A_{in}$ is shifted down at output terminal $A_{out2}$ ($V_{outa}<V_a$ and $V_{outb}<V_b$). The input voltage swing $V_a-V_b$ is also amplified ($V_{outa}-V_{outb}>V_a-V_b$). Amplification occurs only if the input potential at $A_{in}$ is close enough to $V_{CC}$ for N-MOSFET 48 to be saturated, but this is not a serious restriction, because the circuit is intended for use at input potentials close to $V_{CC}$.

In a conventional level shifter, N-MOSFET 48 is replaced by a constant-current source providing a current $I_a$. When the potential of input node $A_{in}$ is $V_a$, the operating point is still $P_a$ and the potential of output node $A_{out2}$ is $V_{outa}$, but when the potential of input node $A_{in}$ is $V_b$, the operating point becomes $P_{bb}$, and the potential of output node $A_{out2}$ becomes $V_{outbb}$. The output voltage swing $V_{outa}-V_{outbb}$ is less than $V_{outa}-V_{outb}$. For signals with the same input voltage swing, the amplifier circuit 36 of this embodiment produces a shifted output potential having a larger output swing than would a conventional level shifter.

(3) Operation and advantages of sense circuit

Basically, the fifth embodiment operates as did the fourth, with the amplifier circuit 36 in FIG. 8 performing the functions of both the inverting amplifier 18 and level shifter 34 in FIG. 6. The only difference is the greater voltage swing obtained at output node $A_{out2}$ in FIG. 8. This enables the sense circuit to tolerate lower voltages and higher currents at the input terminal IN without saturation of P-MOSFET 24; that is, the fifth embodiment has an even wider dynamic range than the fourth embodiment. Incorporation of the shifting function into the amplifier circuit 36 also enables the sense circuit to be configured with fewer circuit elements than the circuit in FIG. 6.

Applications of the amplifier circuit 36 of this embodiment are not restricted to use in sense circuits. It is effective if used as a level shifter in a variety of situations requiring amplified, shifted output: for example, in interface circuits or the like.

6th Embodiment

Figure 10:
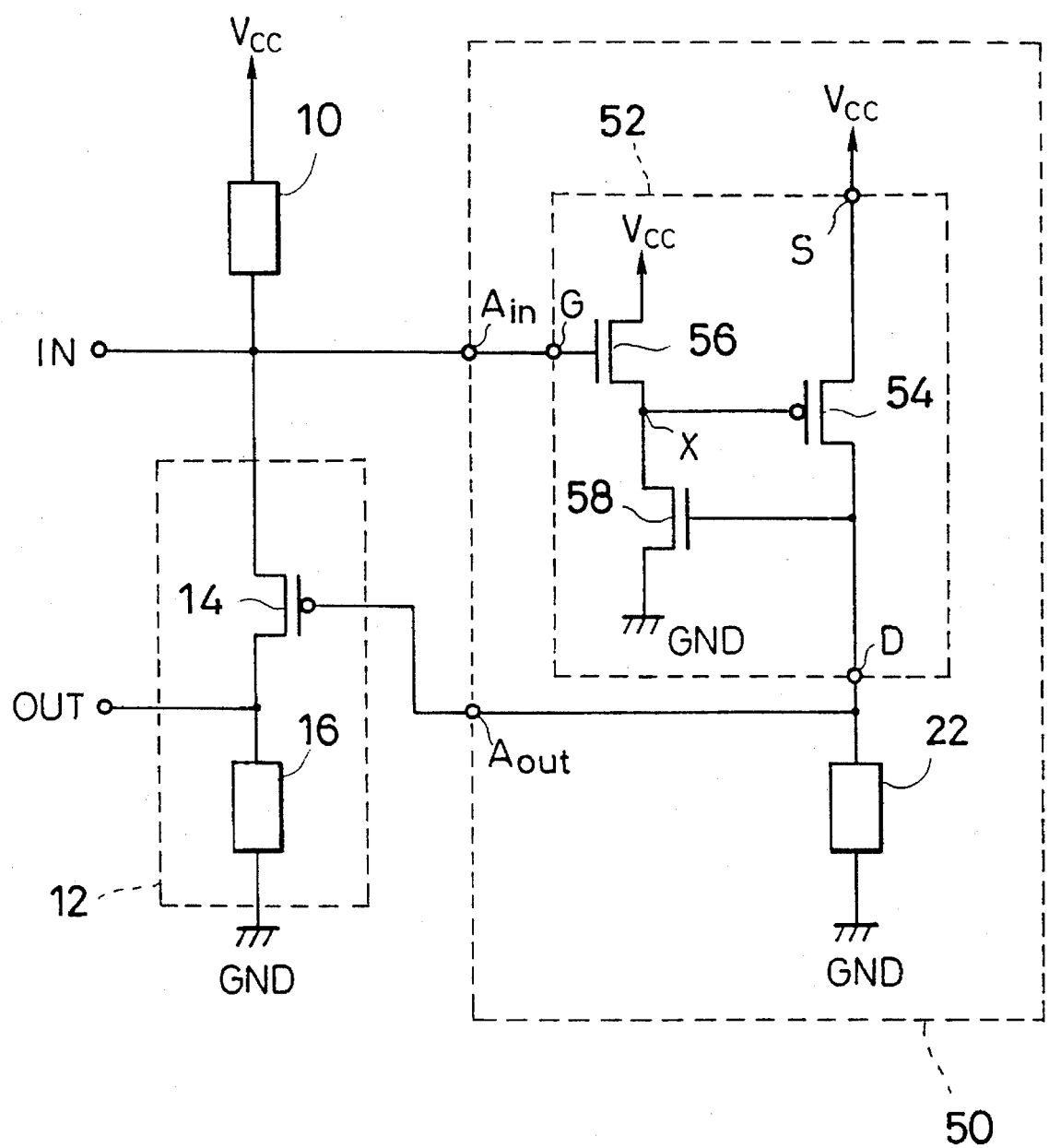
FIG. 10 is a schematic diagram of a sixth novel sense circuit.

FIG. 10 shows a sixth embodiment of the invented sense circuit. Elements common to FIG. 2 have the same reference numerals.

This sense circuit comprises the same load circuit 10 and current-to-voltage converter 12 as in FIG. 2, and an inverting amplifier 50 with a structure differing from FIG. 2. The inverting amplifier 50 has all input node $A_{in}$ coupled to the input terminal IN and an output node $A_{out}$ coupled to the gate of P-MOSFET 14, and comprises a resistance circuit 22 and a novel negative-resistance circuit 52.

The negative-resistance circuit 52 has a control terminal G and input/output terminals S and D, the control terminal G being coupled to input node $A_{in}$, the first input/output terminal S to $V_{CC}$, and the second input/output terminal D to one end of the resistance circuit 22 and to the output node $A_{out}$. The other end of the resistance circuit 22 is coupled to ground. The negative-resistance circuit 52 comprises a P-MOSFET 54 coupled between the input/output terminals S and D, and N-MOSFETs 56 and 58 coupled in series between $V_{CC}$ and ground.

P-MOSFET 54 has its source coupled to the first input/output terminal S, its gate to an internal node X, and its drain to the second input/output terminal D. N-MOSFET 56 has its drain coupled to $V_{CC}$, its gate to control terminal G, and its source to node X. N-MOSFET 58 has its drain coupled to node X, its gate to the second input/output terminal D, and its source to ground.

The negative-resistance circuit 52 provides a variable negative resistance between input/output terminals S and D. Negative resistance means that, beyond a certain point, as the voltage between terminals S and D increases, current flow between terminals S and D decreases. (Strictly speaking, the differential resistance is negative.) The conductance of the negative-resistance circuit also depends on the input potential at the control terminal G: as this input potential increases, the conductance decreases. This is what is meant herein by saying that the negative resistance is variable.

The operation of a negative-resistance circuit of this type will be explained in more detail later, in FIGS. 25 to 28. Here the operating characteristics and advantages of the sense circuit in FIG. 10 will be described with reference to FIGS. 11 to 13. First, the operation of the inverting amplifier 50 will be described.

Figure 11:
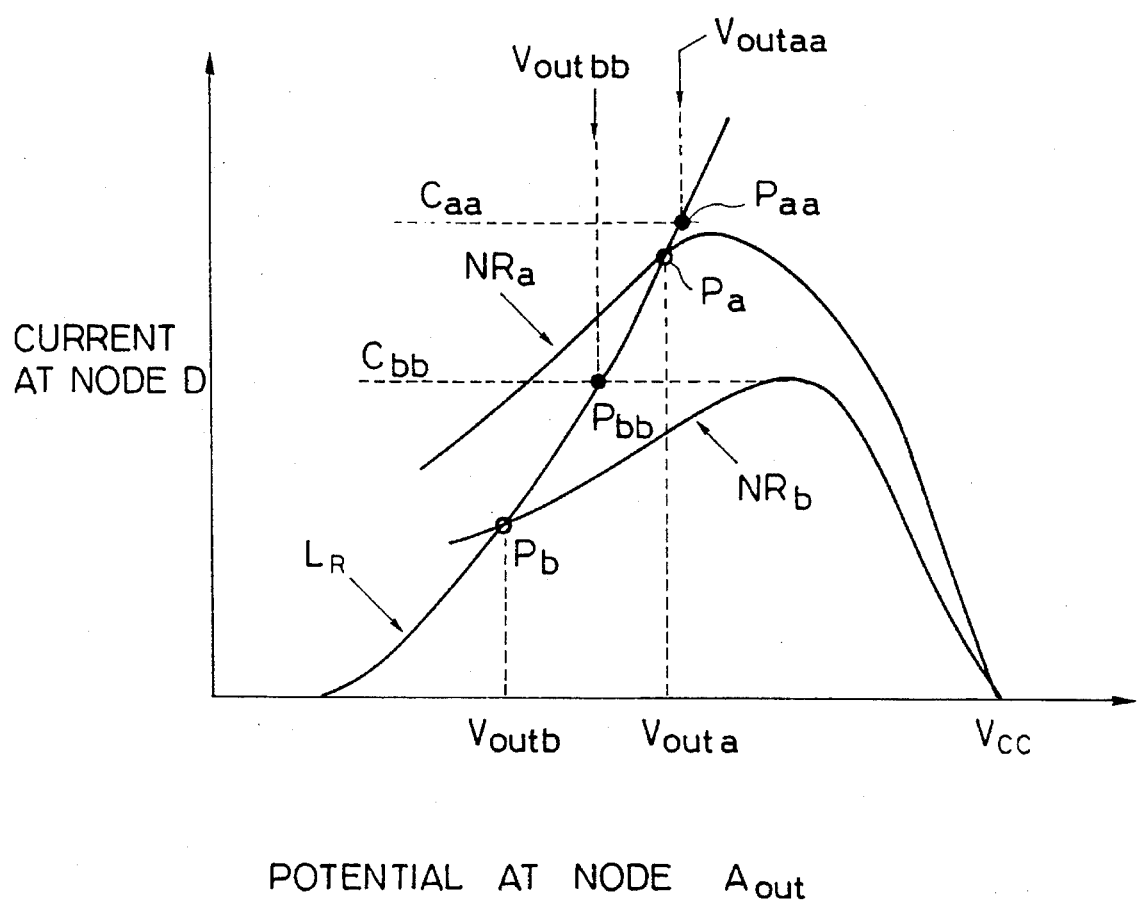
FIG. 11 illustrates volt-ampere characteristics of the negative-resistance circuit and resistance circuit in the amplifier of FIG. 10.

FIG. 11 is a diagram of operating characteristics of the inverting amplifier 50. The vertical axis represents current flowing between the input/output terminals S and D of the negative-resistance circuit 52, hence through the resistance circuit 22. The horizontal axis represents the potential of node $A_{out}$, hence at input/output terminal D.

In FIG. 11, curves $NR_a$ and $NR_b$ are volt-ampere characteristics of the negative-resistance circuit $2 when the potential of input node $A_{in}$ is $V_a$ and $V_b$, respectively, where $V_a<V_b$. On both curves $NR_a$ and $NR_b$, as the potential of the output node $A_{out}$ falls, the current first increases, then decreases. More current (higher conductance) is obtained with the lower $V_a$ than with the higher $V_b$.

Curve $L_R$ in FIG. 11 is a volt-ampere characteristic of the resistance circuit 22 when implemented by, for example, an N-MOSFET with interconnected gate and drain. The operating point of the circuit when the potential of input node $A_{in}$ is $V_a$ is the intersection $P_a$ of curves $NR_a$ and $L_R$, at which the potential of output node $A_{out}$ becomes $V_{outa}$. The operating point of the circuit when the potential of input node $A_{in}$ is $V_b$ is the intersection $P_b$ of curves $NR_b$ and $L_R$, at which the potential of output node $V_{out}$ becomes $V_{outb}$. For an input voltage swing $V_a-V_b$, that is, an output voltage swing $V_{outa}-V_{outb}$ is obtained.

The gain of the inverting amplifier 50 of the present embodiment can be compared with the gain of the inverting amplifier 18 in FIG. 2, in which the negative-resistance circuit 52 is replaced with a depletion-mode P-MOSFET. Curves $C_{aa}$ and $C_{bb}$, indicated by dotted lines in FIG. 11, are volt-ampere characteristics of a depletion-mode P-MOSFET when its gate potential is $V_a$ and $V_b$, respectively. The operating point when the potential of input node $A_{in}$ is $V_a$ becomes $P_{aa}$, and the operating point when the potential of input node $A_{in}$ is $V_b$ becomes $P_{bb}$. For an identical input swing from $V_a$ to $V_b$, the output voltage swing of inverting amplifier 18 in FIG. 2 is $V_{outaa}-V_{outbb}$, which is less than the $V_{outa}-V_{outb}$ voltage swing of inverting amplifier 50 in FIG. 10.

Configuring the inverting amplifier 50 in the present embodiment from a negative-resistance circuit 52 and resistance circuit 22 therefore improves its gain. Another advantage is that the negative-resistance circuit 52 has no depletion-mode transistors, so no special fabrication steps are needed to form them.

The potential of internal node X in FIG. 10 is always less than the potential of control node G by at least $V_{TNN}$, so P-MOSFET 54 in the negative-resistance circuit 52 does not cut off, even when the potential at nodes $A_{in}$ and G is $V_{CC}$. The input terminal IN can therefore be biased close to $V_{CC}$, just as in the first to fifth embodiments, which is an advantage for operation at low supply voltages.

Figure 12:
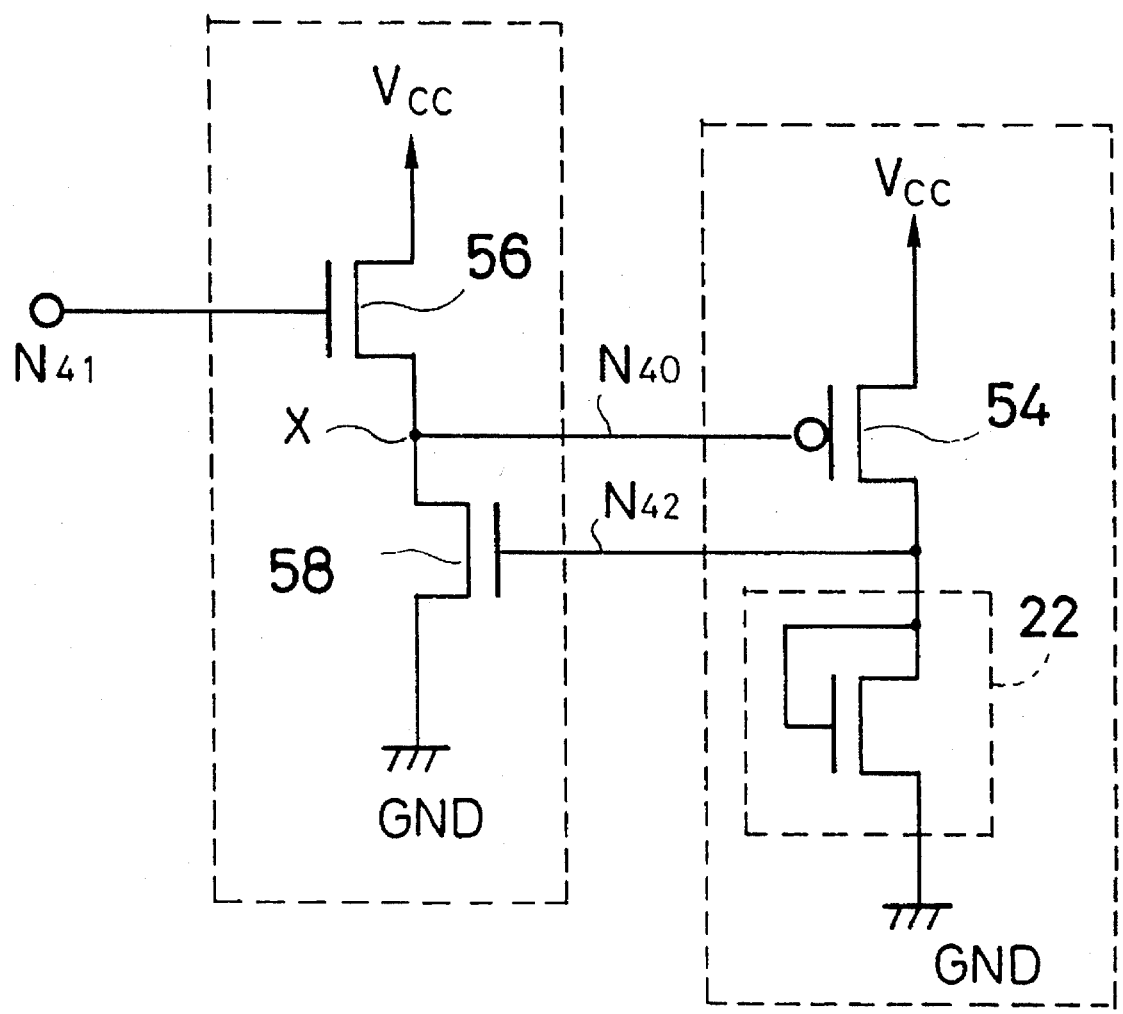
FIG. 12 is a redrawing of the amplifier circuit in FIG. 10.

Next, the stability of operation of the inverting amplifier 50 will be discussed with reference to FIG. 12. FIG. 12 is simply a redrawing of the inverting amplifier 50 in FIG. 10, showing the resistance circuit 22 consisting of an N-MOSFET with interconnected gate and drain as mentioned above. N-MOSFETs 56 and 58 are regarded as constituting a circuit A with input node $N_{42}$ and output node $N_{40}$. P-MOSFET 54 and the resistance circuit 22 are regarded as constituting a circuit B with input node $N_{40}$ and output node $N_{42}$. Circuits A and B are mutually cross-coupled. Node N41 (terminal G in FIG. 10) is biased to a suitable potential, e.g. a potential close to $V_{CC}$.

Figure 13:
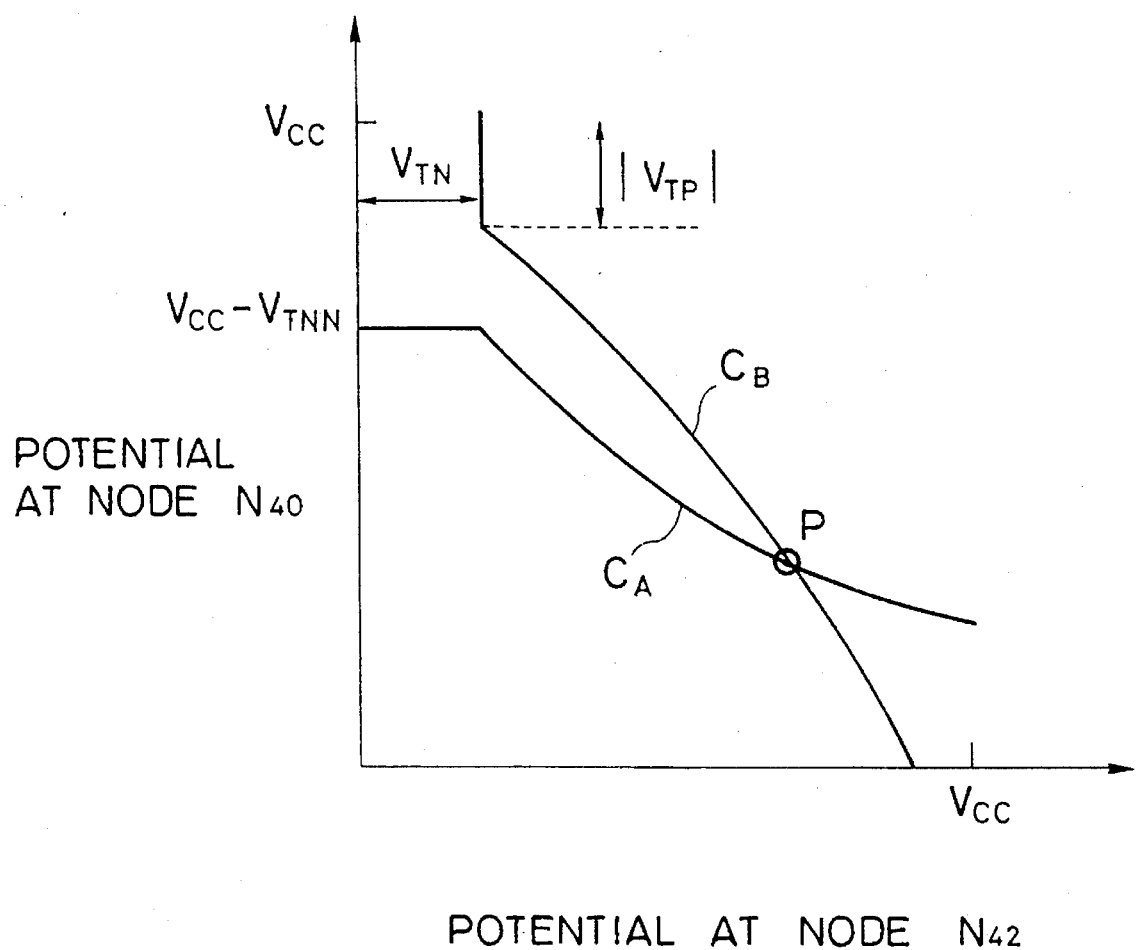
FIG. 13 illustrates input-output characteristics of circuit A and circuit B in FIG. 12.

FIG. 13 shows the input-output characteristics of circuits A and B. The vertical axis in FIG. 13 represents the potential of node $N_{40}$, which is the output node of circuit A and the input node of circuit B. The horizontal axis represents the potential of node $N_{42}$, which is the input node of circuit A and the output node of circuit B. Curve $C_A$ is the input-output characteristic curve of circuit A; curve $C_B$ is the input-output characteristic curve of circuit B.

In circuit A, as the input potential (node $N_{42}$) falls, the output potential (node 40) rises. When the input potential becomes $V_{TN}$, the output potential reaches and remains fixed at $V_{CC}-V_{TNN}$.

In circuit B, as the input potential (node 40) rises, the output potential (node $N_{42}$) falls. When the input potential becomes $V_{CC}-|V_{TP}|$, the output potential reaches and remains fixed at $V_{TN}$. The characteristic curves $C_A$ and $C_B$ therefore intersect at an operating point P.

When the potential of node 40 is $V_{CC}-V_{TNN}$, N-MOSFET 56 in circuit A is strongly back-biased, so $V_{TNN}$ is much greater than $V_{TN}$. Under normal CMOS fabrication conditions with $V_{TN}$ approximately equal to $|V_{TP}|$, $V_{TNN}$ is also much greater than $|V_{TP}|$. This condition ensures that characteristic curves $C_A$ and $C_B$ do not intersect at points other than P. Operation of the inverting amplifier 50 is therefore stable.

7th Embodiment

Figure 14:
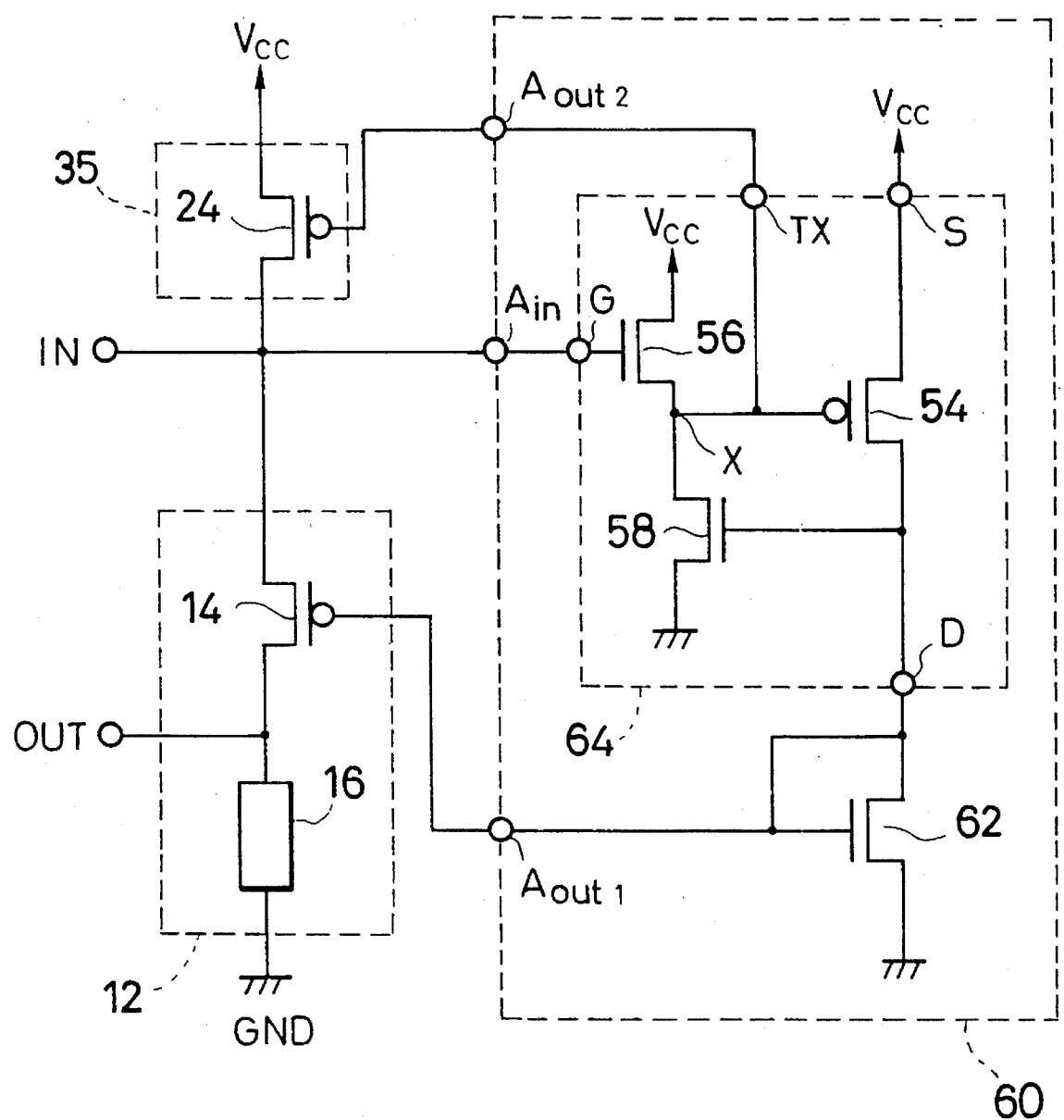
FIG. 14 is a schematic diagram of a seventh novel sense circuit.

This embodiment, shown in FIG. 14, combines the fifth and sixth embodiments. Elements common to FIGS. 8 and 10 have the same reference numerals.

This sense circuit differs from FIG. 8 only in the structure of its amplifier circuit 60. Externally, the amplifier circuit 60 has the same input and output nodes as in FIG. 8, with input node $A_{in}$ coupled to the input terminal IN, output node $A_{out1}$ coupled to the gate of P-MOSFET 14, and output $A_{out2}$ coupled to the gate of P-MOSFET 24.

Internally, the amplifier circuit 60 comprises a resistance circuit consisting of an N-MOSFET 62 with interconnected gate and drain, and a negative-resistance circuit 64. The negative-resistance circuit 64 is identical to the negative-resistance circuit 52 shown in FIG. 10, except that the internal node X has been led out to an output terminal TX. Output terminal TX is coupled to the second output node $A_{out2}$ of the amplifier circuit 60. Input/output terminal D is coupled to the first output node $A_{out1}$, and input/output terminal S to $V_{CC}$. Control terminal G is coupled to the input node $A_{in}$.

The amplifier circuit 60 operates like the amplifier circuit 50 in FIG. 10, so to describe the operation of this sense circuit, all that remains is to describe the relationship of the second output node $A_{out}$ to the input node $A_{in}$. This relationship can be understood by considering the modified circuit shown in FIG. 15, which is obtained from the amplifier circuit 36 of FIG. 8 by replacing the depletion-mode P-MOSFET 38 with a negative-resistance circuit 52 identical to the negative-resistance circuit 52 in FIG. 10.

Figure 15:
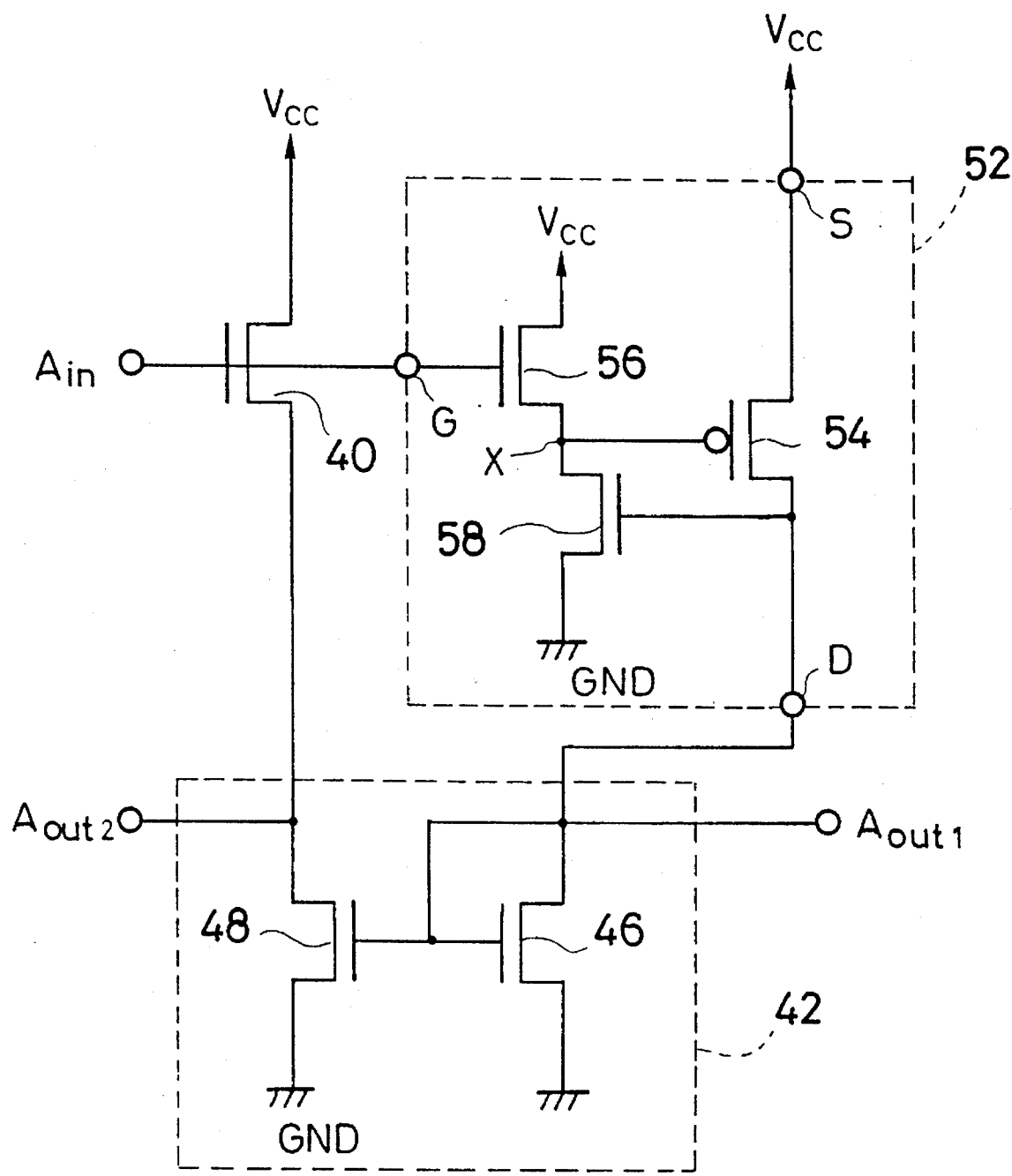
FIG. 15 illustrates a modification of the amplifier circuit in FIG. 8.

The part of FIG. 15 consisting of the negative-resistance circuit 52 and N-MOSFET 46 has the same configuration as the inverting amplifier 50 in FIG. 10. Accordingly, the voltage swing at input node $A_{in}$ is inverted, amplified, and obtained at the second input/output terminal D. As explained in FIG. 10, the gain is larger than when a depletion-mode P-MOSFET is used. Since this second input/output terminal D controls the gate of N-MOSFET 48, it provides a shifted output from the second output node $A_{out2}$, with a larger voltage swing in FIG. 15 than in FIG. 8.

Figure 16:
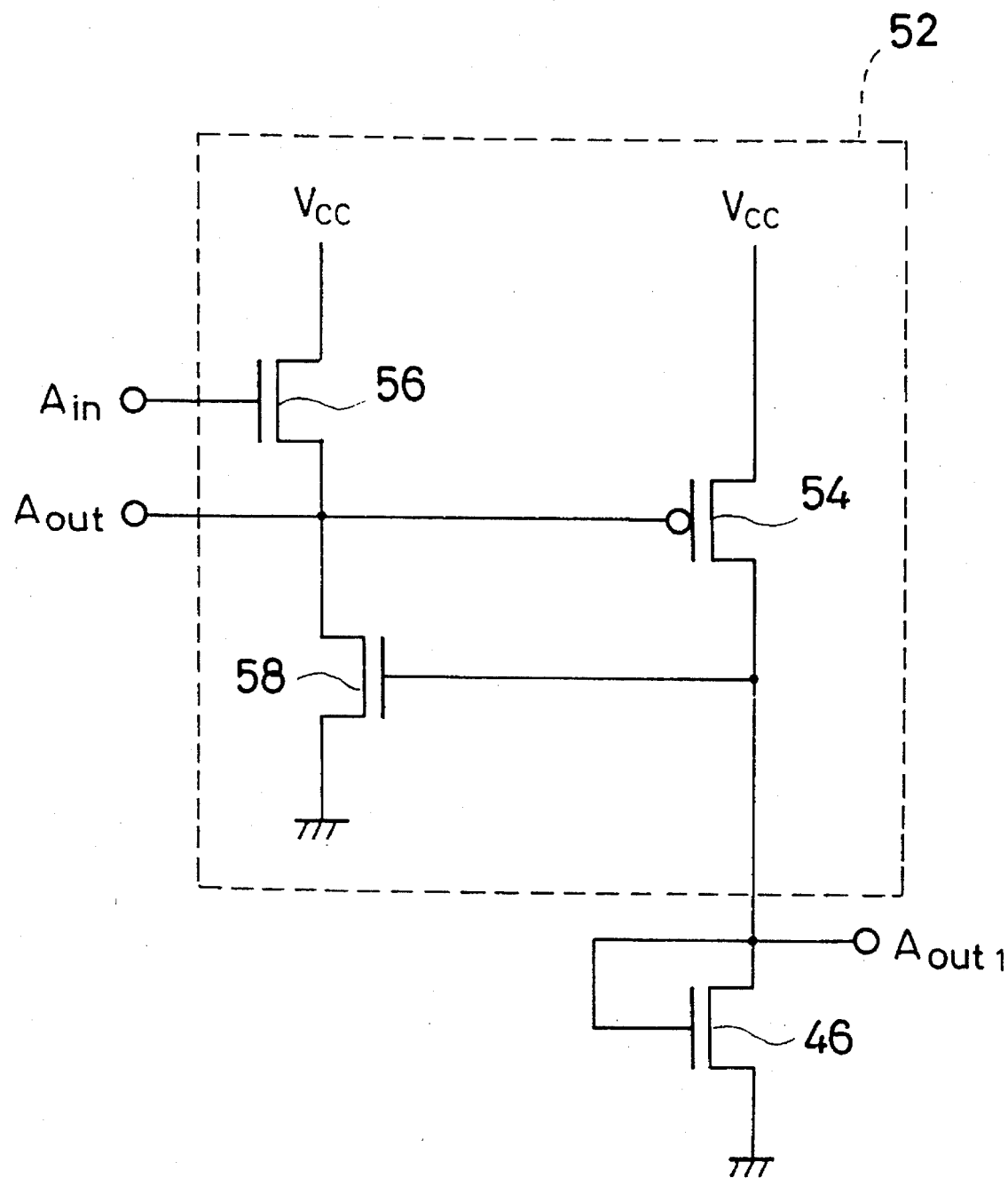
FIG. 16 illustrates a modification of the amplifier circuit in 15, identical to the amplifier circuit in FIG. 14.

In FIG. 15, the gate potentials of N-MOSFETs 40 and 56 are always equal, and the gate potentials of N-MOSFETs 48 and 58 are always equal. If the capability of the N-MOSFET 56 in FIG. 15 (defined by the drain current that can be produced by a drain-source voltage for a fixed gate voltage, for example) is equal to the capability of N-MOSFET 40, and the capability of N-MOSFET 58 is equal to the capability of N-MOSFET 48, then the gate potential of P-MOSFET 54 and the potential of the second output node $A_{out2}$ are always equal. A simpler equivalent circuit can therefore be obtained by connecting the gate of P-MOSFET 54 to the second output node $A_{out2}$ and eliminating N-MOSFETs 40 and 48, as shown in FIG. 6. The circuit in FIG. 16 is none other than the amplifier circuit 60 of FIG. 14.

The amplifier circuit 36 in FIG. 8 and the amplifier circuit 60 in FIG. 14 both comprise four transistors, but the amplifier circuit 60 in FIG. 14 is easier to fabricate because it has no depletion-mode transistors. Moreover, it provides a higher gain for the shifted output at the second output node $A_{out2}$. Other features of the seventh embodiment are as already noted in the first to sixth embodiments, including stability of operation, suitability for use at low supply voltages, and a wide dynamic range.

Applications of the amplifier circuit 60 in FIG. 14 are not restricted to sense circuits; it is effective when used as a level shifter and inverting amplifier in various other types of circuits as well.

The preceding sense circuits can be used in a semiconductor memory (e.g. DRAM, SRAM, or ROM) by coupling their input terminal IN to a data line as shown, for example, in FIG. 1. The load circuit 10, 32, or 35 then becomes a data-line load circuit that biases the data line to a potential near $V_{CC}$.

The embodiments so far have shown a sense circuit with a single input terminal, but in memory circuits, differential data signals are often employed. The next embodiments will show how the invention can be adapted to sense differential current inputs and produce differential voltage outputs.

8th Embodiment

Figure 17:
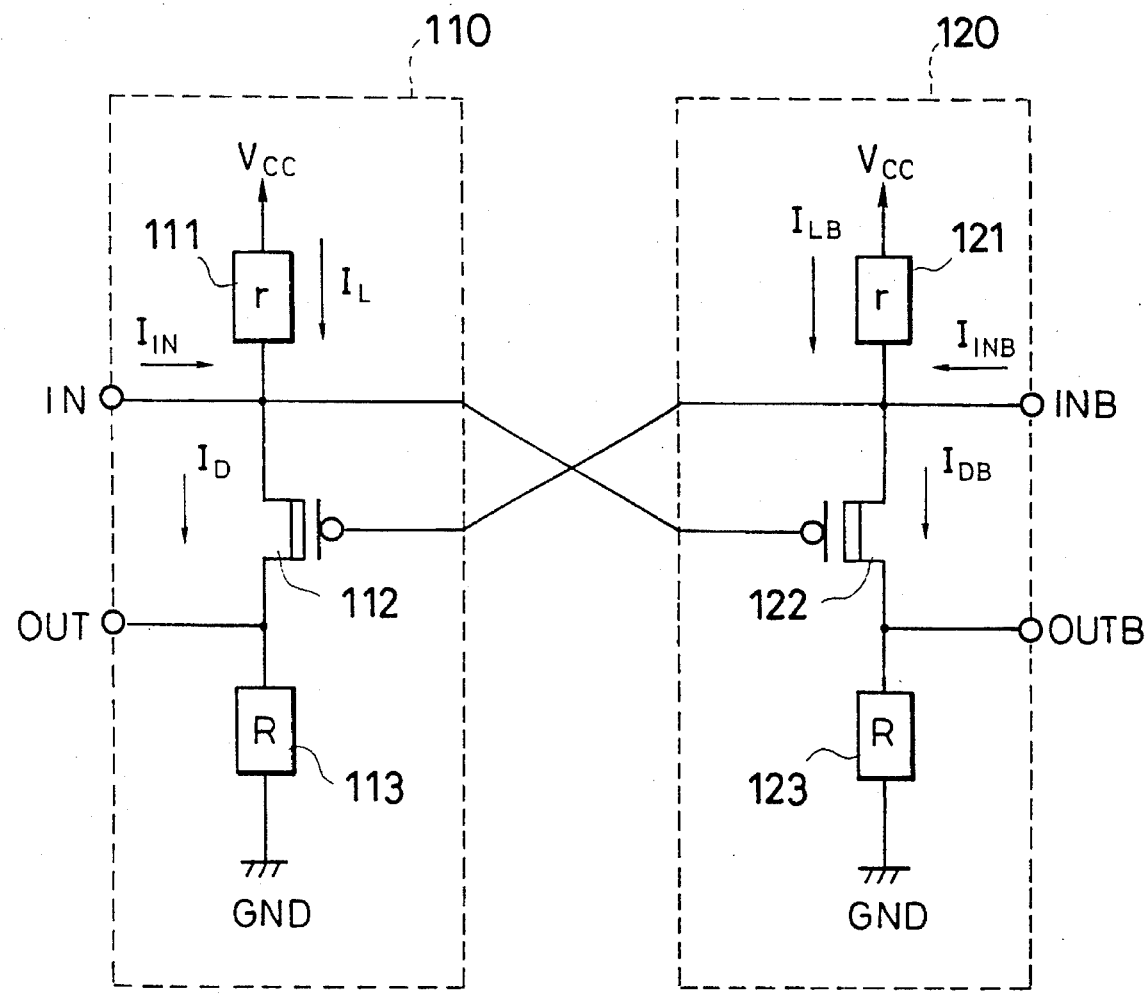
FIG. 17 is a schematic diagram of an eighth novel sense circuit.

FIG. 17 shows a sense circuit illustrating an eighth embodiment of the invention. This sense circuit comprises a first circuit section 110 having a first output terminal OUT and a first input terminal IN, and a second circuit section 120 with the same structure as the first circuit section 110, having a second output terminal OUTB and a second input terminal INB.

The first circuit section 110 has a load circuit 111 coupled between the first input terminal IN and $V_{CC}$. The input terminal IN is coupled to the source of a first depletion-mode P-MOSFET 112, the gate of which is coupled to the second input terminal INB. The drain of P-MOSFET 112 is coupled to the first output terminal OUT, and is coupled through a first resistance circuit 113 to ground.

Similarly, the second circuit section 120 has a load circuit 121 coupled between the second input terminal INB and the supply voltage $V_{CC}$. The input terminal INB is coupled to the source of a second depletion-mode P-MOSFET 122, the gate of which is coupled to the first input terminal IN. The drain of P-MOSFET 122 is coupled to the second output terminal OUTB, and through a second resistance circuit 123 to ground.

This sense circuit is thus configured so that the gates and sources of the two P-MOSFETs 112 and 122 are mutually cross-coupled, and these two transistors operate mutually as source-followers. P-MOSFETs 112 and 122 are designed to saturate during normal operation. Operation will be described next.

The input terminals IN and INB are both biased close to the supply voltage $V_{CC}$. In the following analysis, the input terminals IN and INB will be treated as current sinks. $I_{IN}$ will denote current flowing into the sense circuit at input terminal IN (if current is actually flowing out at input terminal IN, then $I_{IN}$ is negative.) Similarly, $I_{INB}$ will denote current flowing into the sense circuit at input terminal INB.

If current $I_{IN}$ increases and current $I_{INB}$ decreases, the potential $V_{IN}$ of input terminal IN will rise slightly, and the potential $V_{INB}$ of input terminal INB will fall slightly. The conductance of P-M05FET 112 will therefore increase while the conductance of P-MOSFET 122 decreases. The current $I_D$ flowing through P-MOSFET 112 will then increase, the current $I_{DB}$ flowing through P-MOSFET 122 will decrease, the voltage drop across resistance circuit 113 will rise, the voltage drop across resistance circuit 123 will fall, and a potential difference $V_{OUTdif}$ will be obtained at output terminals OUT and OUTB.

The increase in current $I_D$ substantially matches the increase in current $I_{IN}$, so no great change occurs in the current $I_L$, flowing through the data-line load circuit 111. Similarly, there is no great change in the current $I_{LB}$ flowing through the data-line load circuit 121. The potentials of input terminals IN and INB therefore change only slightly, and the difference $V_{INdif}$ between them can be kept small.

Next, the operation of this embodiment will be described mathematically.

Let r be the resistance value of the load circuits 111 and 112, R be the resistance value of the resistance circuits 113 and 123, $g_m$ be the transconductance of P-MOSFETs 112 and 122, and $I_{INdif}$ be the differential current flow to input terminals IN and INB ($I_{INdif}=I_{IN}-I_{INB}$). From the symmetry of the first and second circuit sections 110 and 120, if $I_{INdif}=0$, then $V_{IN}=V_{INB}$, $I_D=I_{DB}$, and $V_{OUTdif}=0$.

Next, assume that a differential current signal is received, such that $I_{INdif}>0$. Let $\Delta I_{IN}$ be the resulting change in the current $I_{IN}$, $\Delta I_{INB}$ the change in the current $I_{INB}$, $\Delta I_D$ the change in the current $I_D$, $\Delta I_{DB}$ the change in the current $I_{DB}$, $\Delta V_{IN}$ the change in the potential $V_{IN}$, and $\Delta V_{INB}$ the change in the potential $V_{INB}$. Then:

$$\Delta V_{IN}=-r(\Delta I_D-\Delta I_{IN}) \quad (1)$$

$$\Delta V_{INB}=-r(\Delta I_{DB}-\Delta I_{INB}) \quad (2)$$

$$\Delta I_D=g_m(\Delta V_{IN}-\Delta V_{INB}) \quad (3)$$

$$\Delta I_{DB}=g_m(\Delta V_{INB}-\Delta V_{IN}) \quad (4)$$

Therefore, $$\Delta I_D-\Delta I_{DB}=[1/(1+½rg_m)](\Delta I_{IN}-\Delta I_{INB}) \quad (5)$$

If $2rg_m \gg 1$, then $$\Delta I_D-\Delta I_{DB}=\Delta I_{IN}-\Delta I_{INB} \text{ (approximately)} \quad (6)$$

Also, $$\Delta V_{IN}-\Delta V_{INB} = [1/(2g_m)](\Delta I_D-\Delta I_{DB}) \quad (7)$$
$$= [1/(2g_m)](\Delta I_{IN}-\Delta I_{INB})$$
(approximately)

Furthermore, $$V_{INdif}=\Delta V_{IN}-\Delta V_{INB} \quad (8)$$

$$I_{INdif}=\Delta I_{IN}-\Delta I_{INB} \quad (9)$$

$$V_{OUTdif}=R(\Delta I_D-\Delta I_{DB}) \quad (10)$$

From equations (6) and (7), it follows that:

$$V_{INdif}=[1/(2g_m)]I_{INdif} \quad (11)$$

$$V_{OUTdif}=R \cdot I_{INdif} \quad (12)$$

If the transconductance $g_m$ and resistance value R are both sufficiently large, a slight current differential $I_{INdif}$ at the input terminals IN and INB will produce a large output voltage differential $V_{OUTdif}$ between the output terminals OUT and OUTB, while causing only a small potential difference $V_{INdif}$ between the input terminals IN and INB. The equivalent impedance between input terminals IN and INB is also extremely small, being $½g_m$. In a memory circuit, this enables fast read-out of data even if long data lines having a large parasitic capacitance are coupled to the input terminals IN and INB.

In addition, with reference to equation (5), no matter how large $rg_m$ becomes, $\Delta I_D-\Delta I_{DB}$ will still be less than $\Delta I_{IN}-\Delta I_{INB}$. The circuit is therefore extremely stable, will not oscillate or latch up, and has an ample operating margin with respect to fabrication tolerances and noise. Its stability will be described with reference to FIG. 18.

Figure 18:
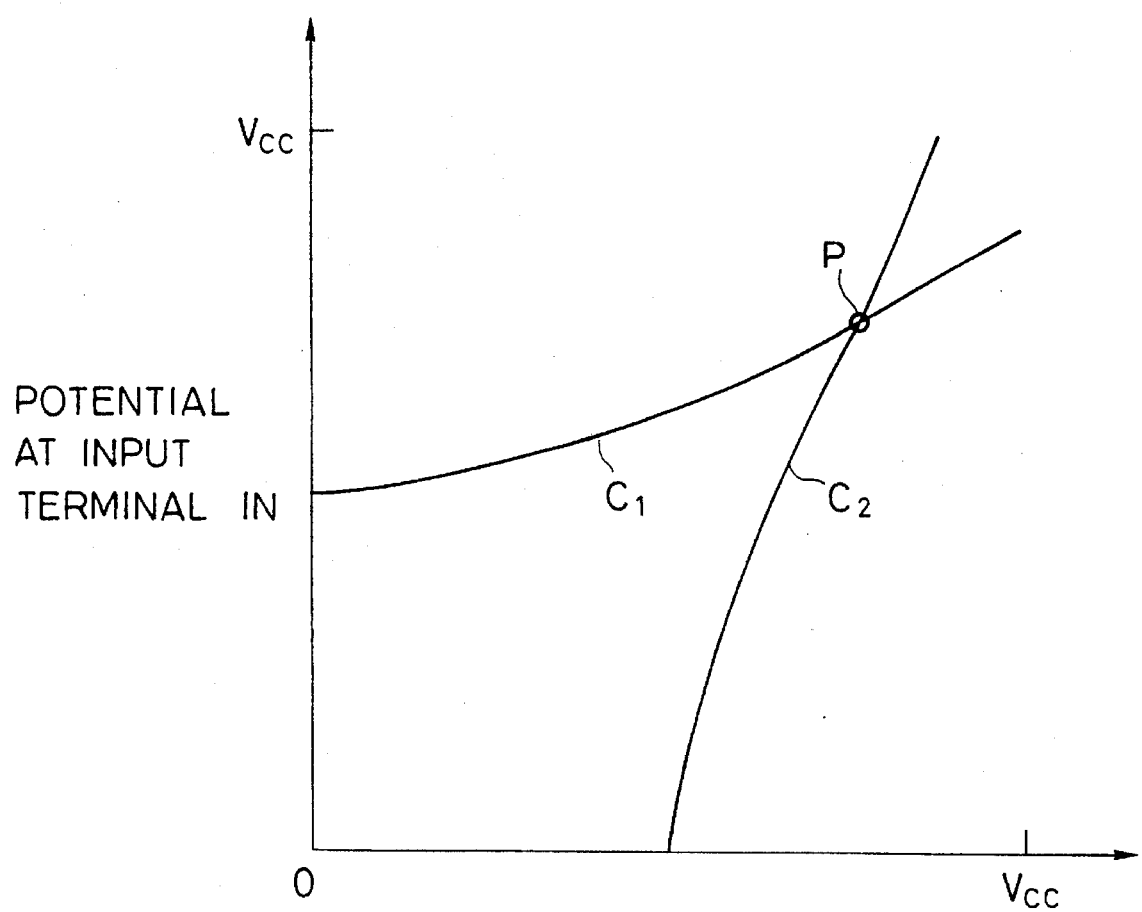
FIG. 18 illustrates input-output characteristics of the first and second circuit sections in FIG. 17.

FIG. 18 shows input-output voltage characteristics of the first and second circuit sections 110 and 120, assuming that there is no current differential between the input terminals IN and INB. The horizontal axis indicates the potential of the second input terminal INB, which potential is here considered as being output from the second circuit section 120 and input to the first circuit section 110. The vertical axis indicates the potential of the first input terminal IN, which is considered as being output from the first circuit section 110 and input to the second circuit section 120.

With these definitions of input and output, curve $C_1$ is the input-output characteristic of the first circuit section 110, and curve $C_2$ is the input-output characteristic of the second circuit section 120. In each circuit section, as the input potential varies between ground and $V_{CC}$, the output potential varies between two intermediate values determined by the resistances of the load circuits 111 and 121 and resistance circuits 113 and 123. That is, each circuit operates as an amplifier with a gain of less than unity. In this respect the eighth embodiment differs from the first seven embodiments, which employed inverting amplifiers.

In FIG. 18, curves $C_1$ and $C_2$ intersect at a single operating point P, and diverge from each other as they move away from point P. Even if curves $C_1$ and $C_2$ are altered by fabrication variations or noise, they are unlikely to intersect at multiple operating points. Accordingly, the sense circuit will not oscillate. Nor can it latch up in a state in which one input terminal is high and the other low, because feedback operates to keep both input terminals IN and INB at substantially the same potential.

The drain-source voltage needed to saturate the depletion-mode P-MOSFETs 112 and 122 can be made quite small, so adequate gain can be obtained even in operation at low supply voltages.

9th Embodiment

Figure 19:
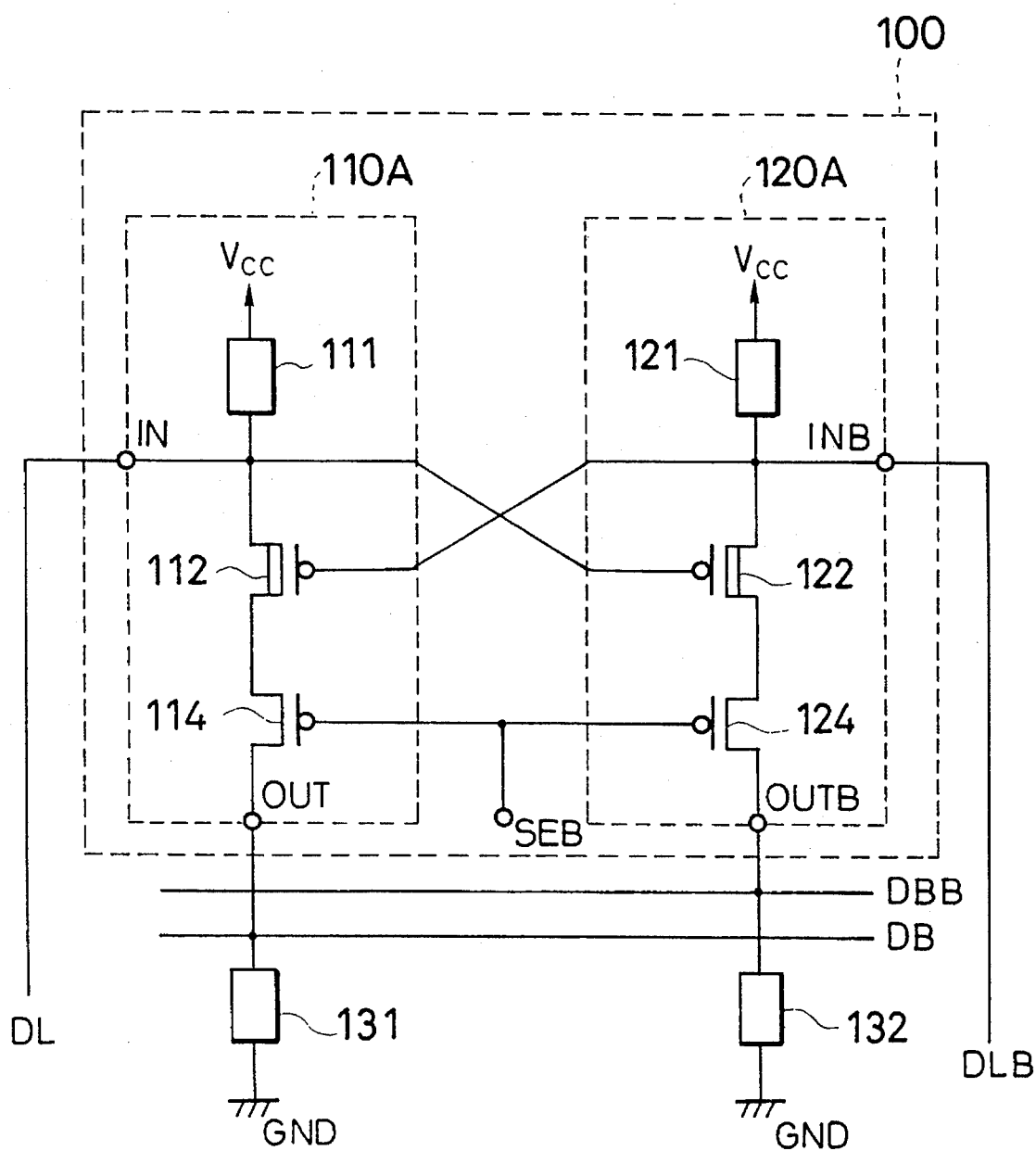
FIG. 19 is a partial schematic diagram of a memory circuit incorporating a ninth novel sense circuit.

FIG. 19 is a partial circuit diagram of a memory circuit illustrating a ninth embodiment of the invention. Elements identical to elements in FIG. 17 have the same reference numerals.

This memory circuit comprises a sense circuit 100 generally similar to the sense circuit of FIG. 17. The sense circuit 100 comprises a first circuit section 110A having a first output terminal OUT and a first input terminal IN, and a second circuit section 120A, identical in structure to the first circuit section 110A, having a second output terminal OUTB and a second input terminal INB. The input terminals IN and INB are coupled to a pair of data lines DL and DLB.

The data-line load circuits 111 and 121 and depletion-mode P-MOSFETs 112 and 122 are as in FIG. 17. Differing from FIG. 17, the first circuit section 110A has a P-MOSFET 114 coupled in series between the drain of P-MOSFET 112 and the first output terminal OUT. The second circuit section 120A has a similar P-MOSFET 124 coupled in series between the drain of P-MOSFET 122 and the second output terminal OUTB. The gates of P-MOSFETs 114 and 124 are both coupled to a sense-enable terminal SEB. P-MOSFETs 114 and 124 function as switches that enable and disable the sense circuit 100.

The first and second output terminals OUT and OUTB of the sense circuit 100 are coupled to data bus lines DB and DBB, respectively. Other identical sense circuits, not shown in the drawing, are also coupled to data bus lines DB and DBB. Data bus lines DB and DBB are coupled to ground through a first resistance circuit 131 and a second resistance circuit 132, respectively. The pair of resistance circuits 131 and 132 serves all the sense circuits coupled to data bus lines DB and DBB, taking the place of the resistance circuits 113 and 123 in FIG. 17.

Next, the operation will be described.

When the memory is not being accessed, the sense-enable terminals SEB of all sense circuits are high (at the $V_{CC}$ potential), switching off P-MOSFETs 114 and 124 in each sense circuit so that no current flows. In this disabled state the input terminals IN and INB are biased through the load circuits 111 and 121 to $V_{CC}$. This is close to the level of the data lines DL and DLB in the operating state, permitting a rapid transition from the disabled state to the operating state.

When a read access occurs, the sense-enable terminal SEB of one sense circuit (the sense circuit 100 in FIG. 19, for example) goes low (to the ground potential), turning on P-MOSFETs 114 and 124. The enabled sense circuit 100 now operates substantially like the sense circuit in FIG. 17, being unaffected by the other sense circuits coupled to the data bus lines DB and DBB, which are still disabled. P-MOSFET 112 and the first resistance circuit 131 are coupled in series between input terminal IN and ground; likewise P-MOSFET 122 and the second resistance circuit 132 between input terminal INB and ground. A small current differential on data lines DL and DLB is converted to a large voltage differential on data bus lines DB and DBB.

Operation of this memory circuit does not require the switching P-MOSFETs 114 and 124 to be saturated, which is an advantage in operation at low supply voltages.

10th Embodiment

Figure 20:
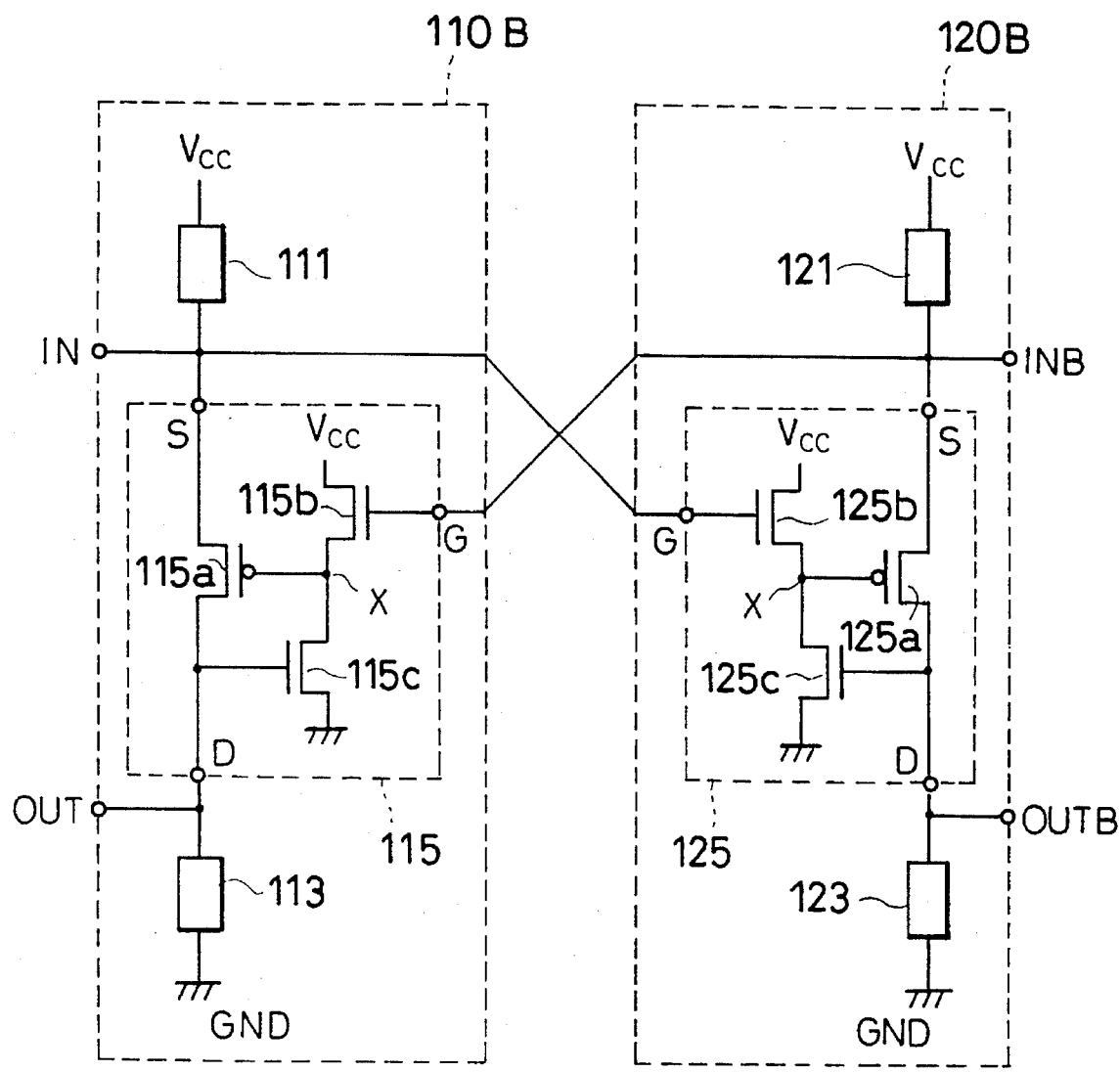
FIG. 20 is a schematic diagram of a tenth novel sense circuit.

FIG. 20 shows a sense circuit illustrating a tenth embodiment of the invention. Elements identical to elements in FIG. 17 have the same reference numerals.

This sense circuit comprises a first circuit section 110B having a first negative-resistance circuit 115 in place of the first depletion-mode P-MOSFET 112 of FIG. 17, and a second circuit section 120B having a second negative-resistance circuit 125 in place of the second depletion-mode P-MOSFET 122 of FIG. 17.

Negative-resistance circuits 115 and 125 are similar to the negative-resistance 52 introduced in FIG. 10, with input/output terminals S and D and a control terminal G. In the first circuit section 110B, the first input/output terminal S of the negative-resistance circuit 115 is coupled to the first input terminal IN, and through the first load circuit 111 to $V_{CC}$. The second input/output terminal D is coupled to the first output terminal OUT, and through the first resistance circuit 113 to ground. The control terminal G is coupled to the second input terminal INB in the second circuit section 120B.

The negative-resistance circuit 125 in the second circuit section 120B is connected in an analogous manner, as shown in the drawing.

Internally, the negative-resistance circuits 115 and 125 have the same structure as the negative-resistance circuit 52 in FIG. 10, with P-MOSFETs 115a and 125a corresponding to P-MOSFET 54, N-MOSFETs 115b and 125b to N-MOSFET 56, and N-MOSFETs 115c and 125c to N-MOSFET 58. As in FIG. 10, the two N-MOSFETs in each negative-resistance circuit are coupled in series between $V_{CC}$ and ground.

The negative-resistance circuits 115 and 125 operate as already described in FIGS. 10 and 11, providing a variable negative resistance between the input/output terminals S and D), responsive to the potential of the control terminal G. Even if the input terminals IN and INB are biased at $V_{CC}$, the P-MOSFETs 115a and 125a do not cut off.

If the potential of the second input terminal INB falls, for example, the conductance of P-MOSFET 115a will increase, more current will flow through the first negative-resistance circuit 115 and the potential of the first output terminal OUT will rise. That is, the first and second negative-resistance circuits 115 and 125 operate as analogues of depletion-mode P-MOSFETs, except that, as discussed in FIG. 11, they afford higher gain. In the receding equations (1) to (12), use of the negative-resistance circuits 115 and 125 yields a larger transconductance $g_m$, thereby reducing the voltage differential between the input terminals IN and INB.

The tenth embodiment has the same advantages as the eighth, with the further advantages of higher gain and easier fabrication, since no depletion-mode P-MOSFETs are required.

In FIG. 20, the first input terminals S and control terminals G of the first and second negative-resistance circuits 115 and 125 are cross-coupled, so the first circuit section 110B and second circuit section 120B operate mutually as source-followers. Therefore, although the gain of the sense circuit is raised, its loop gain does not exceed unity, and stable operation is obtained as was shown in FIG. 18. This is also clear from equation (5), because $\Delta I_D - I_{DB}$ remains less than $\Delta I_{IN} - \Delta I_{INB}$ even if $g_m$ approaches infinity.

In the present embodiment, it is necessary for the P-MOSFETs 115a and 125a in the first and second negative-resistance circuits 115 and 125 to be saturated. Therefore, the potentials of the first and second input terminals IN and INB must be at least $V_{TP+VR}$ (where $V_R$ is the potential drop of the resistance circuits 113 and 123). However, this is a less stringent constraint than found in the prior art.

11th Embodiment

Figure 21:
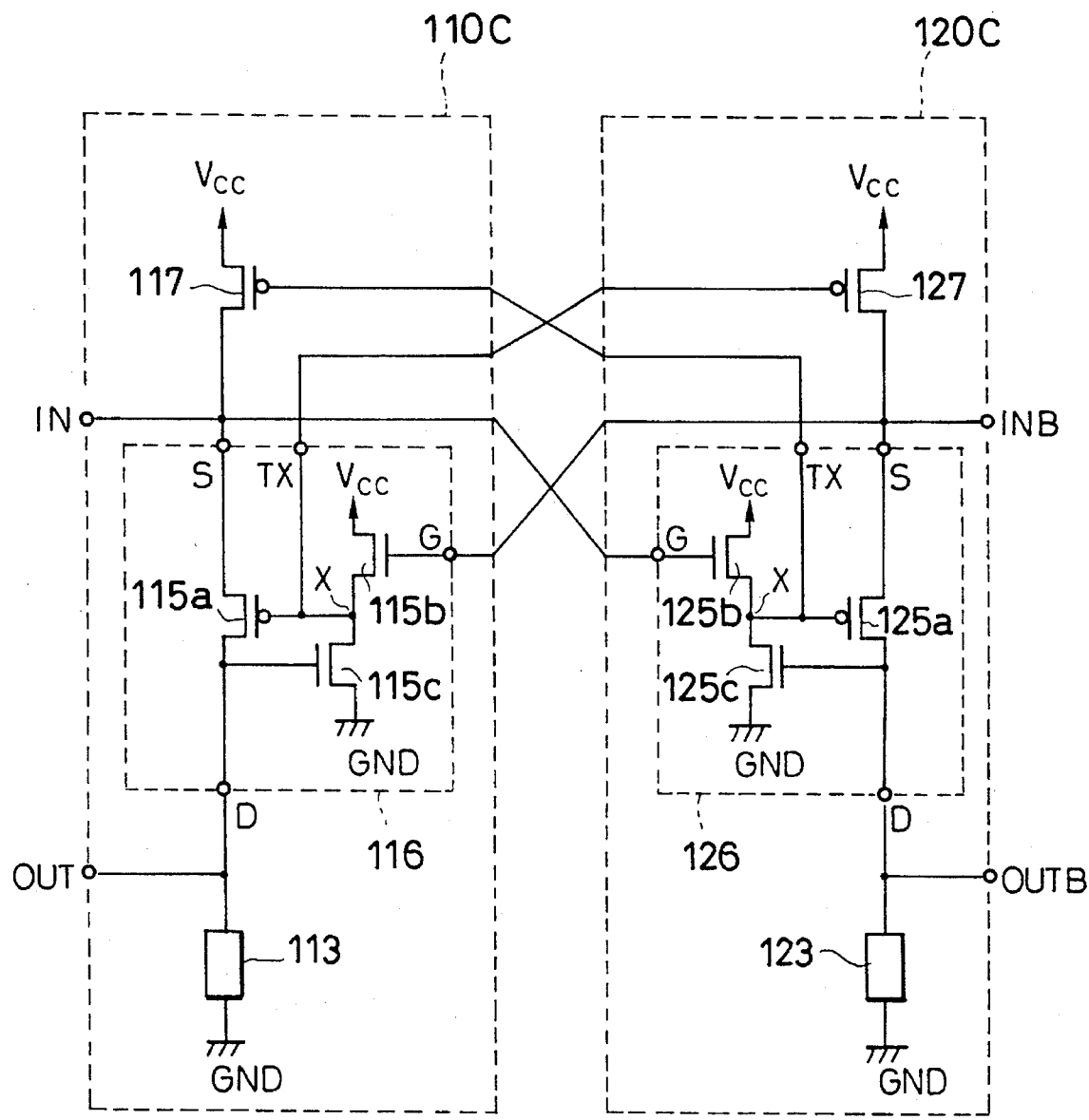
FIG. 21 is a schematic diagram of an eleventh novel sense circuit.

FIG. 21 shows a sense circuit illustrating an eleventh embodiment of the invention, comprising first and second circuit sections 110C and 120C. Elements identical to elements in FIG. 20 have the same reference numerals.

This sense circuit uses negative-resistance circuits 116 and 126 which are identical to the negative-resistance circuits in FIG. 20, except that they have additional output terminals TX coupled to internal nodes X, as in FIG. 14. The output terminal TX of the first negative-resistance circuit 110C is coupled to the gate of a P-MOSFET 127 that replaces the load circuit 121 of FIG. 20. The output terminal TX of the second negative-resistance circuit 120C is coupled to the gate of a P-MOSFET 117 that replaces the load circuit 111 of FIG. 20.

This embodiment combines the features of the seventh and tenth embodiments. The potential of the second input terminal INB is shifted down, amplified, and obtained at output terminal TX of the first negative-resistance circuit 116. The gate potential of the P-MOSFET 127 coupled to the second input terminal INB therefore drops together with the fall of the potential of the input terminal INB, and the current flowing through the P-MOSFET 127 increases. The load P-MOSFET 127 operates as if the range of its non-saturated region were expanded, and the linearity of its load characteristic is improved. The same holds for the load P-MOSFET 117 in the first circuit section 110C. A sense circuit with a wide dynamic range is thereby obtained.

12th Embodiment

Figure 22:
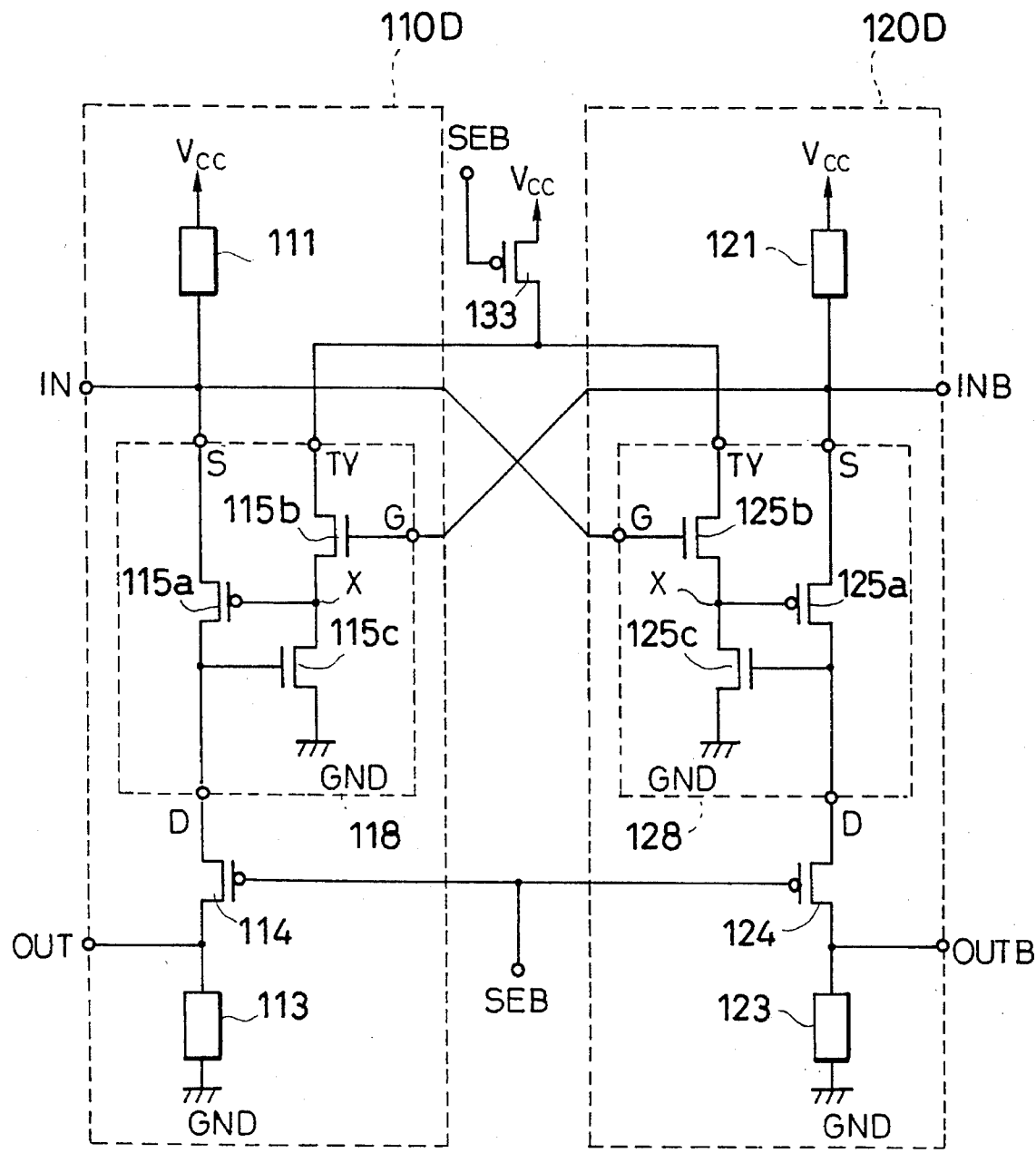
FIG. 22 is a schematic diagram of a twelfth novel sense circuit.

FIG. 22 shows a sense circuit illustrating a twelfth embodiment of the invention, comprising first and second circuit sections 110D and 120D. Elements identical to elements in FIG. 20 have the same reference numerals.

The first and second circuit sections 110D and 120D comprise first and second negative-resistance circuits 118 and 128 that are similar to the negative-resistance circuits 115 and 125 in FIG. 20, except that the drains of N-MOSFETs 115b and 125b are coupled to terminals TY instead of to $V_{CC}$. Terminals TY of the first and second negative-resistance circuits 118 and 128 are both coupled through a single switching P-MOSFET 133 to $V_{CC}$.

This sense circuit has the same switching P-MOSFETs 114 and 124 as used in the memory circuit of FIG. 19. P-MOSFET 114 is coupled in series between the second input/output terminal D of the first negative-resistance circuit 118 and the first output terminal OUT. P-MOSFET 124 is coupled in series between the second input/output terminal D of the second negative-resistance circuit 118 and the second output terminal OUTB. The gates of P-MOSFETs 114, 124, and 133 are all controlled by a sense-enable signal SEB.

When the sense-enable signal SEB is high, P-MOSFETs 14, 124, and 133 are switched off and no current flows through the first and second circuit sections 110D and 120D. When the sense-enable signal SEB is low, P-MOSFETs 114, 124, and 133 are switched on and this sense circuit operates like the one in FIG. 20.

As noted in FIG. 19, when the sense circuit is disabled (SEB high), the input terminals IN and INB are biased at $V_{CC}$, which is close to their operating level, so a rapid transition can be made from the disabled state to the operating state. Also, it is not necessary for P-MOSFETs 114 and 124 to be saturated in these sense operations, which is an advantage for operation at low supply voltages.

The input terminals IN and INB in FIG. 22 can be coupled to data lines, and the output terminals OUT and OUTB to data bus lines, in the same way as in FIG. 19, to configure the read-out circuit of a semiconductor memory.

Figure 23:
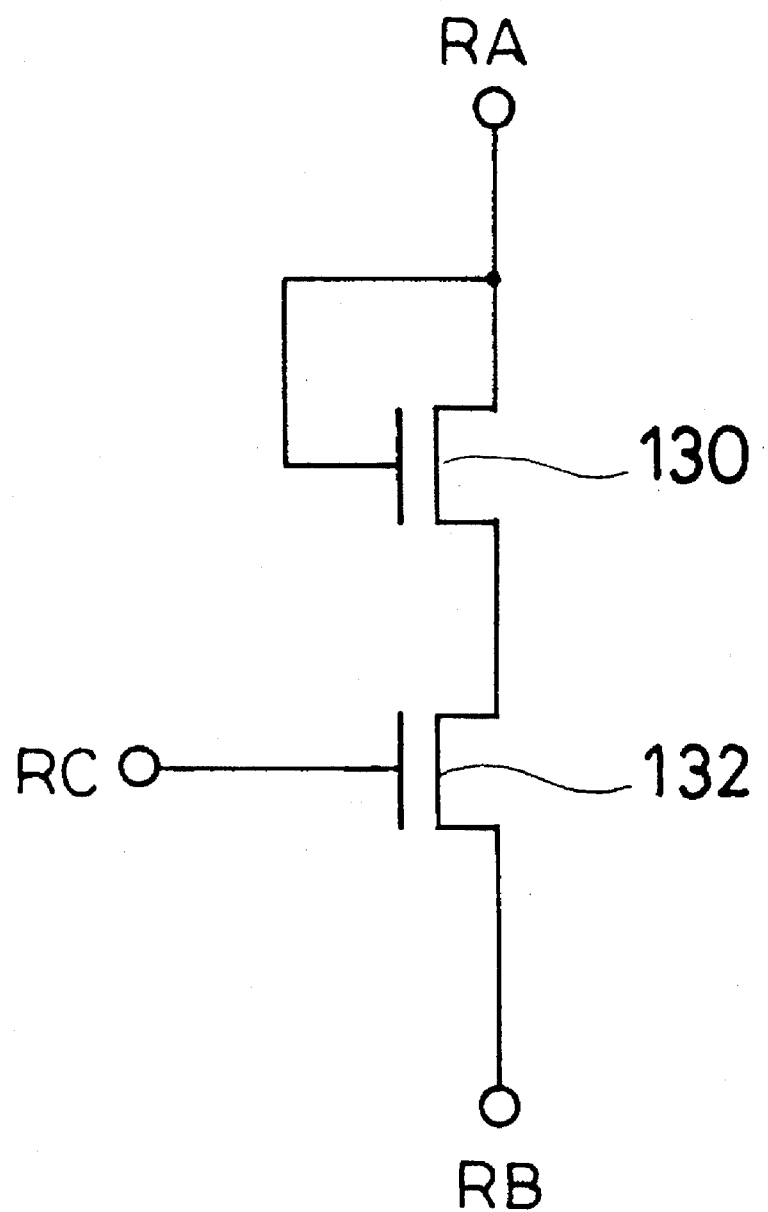
FIG. 23 is a schematic diagram of a resistance circuit.

To reduce power dissipation in earlier embodiments, the resistance circuits 16 and 22 in FIGS. 2, 8, 10, and 14 and the resistance circuits 113 and 123 in FIGS. 17, 20, and 21 may also comprise a resistance coupled in series with a switch. For example, a resistance circuit as shown in FIG. 23 can be used, comprising a terminal RA coupled to a sense-circuit output terminal, an N-MOSFET 130 with drain and gate coupled to terminal RA and acting as a resistive element, an N-MOSFET 132 with drain coupled to the source of N-MOSFET 130 and acting as a switch, a terminal RB coupled to the source of N-MOSFET 132, and a terminal RC coupled to the gate of N-MOSFET 132. Terminal RB is coupled to ground, for example. Terminal RC receives a control signal that switches N-MOSFET 132 off to prevent current flow when the connected sense circuit is inactive.

The novel negative-resistance circuit employed in several of the preceding sense circuits has other applications as well. Further embodiments of this negative-resistance circuit and of a Schmitt trigger using it will be described next.

13th Embodiment

Figure 24:
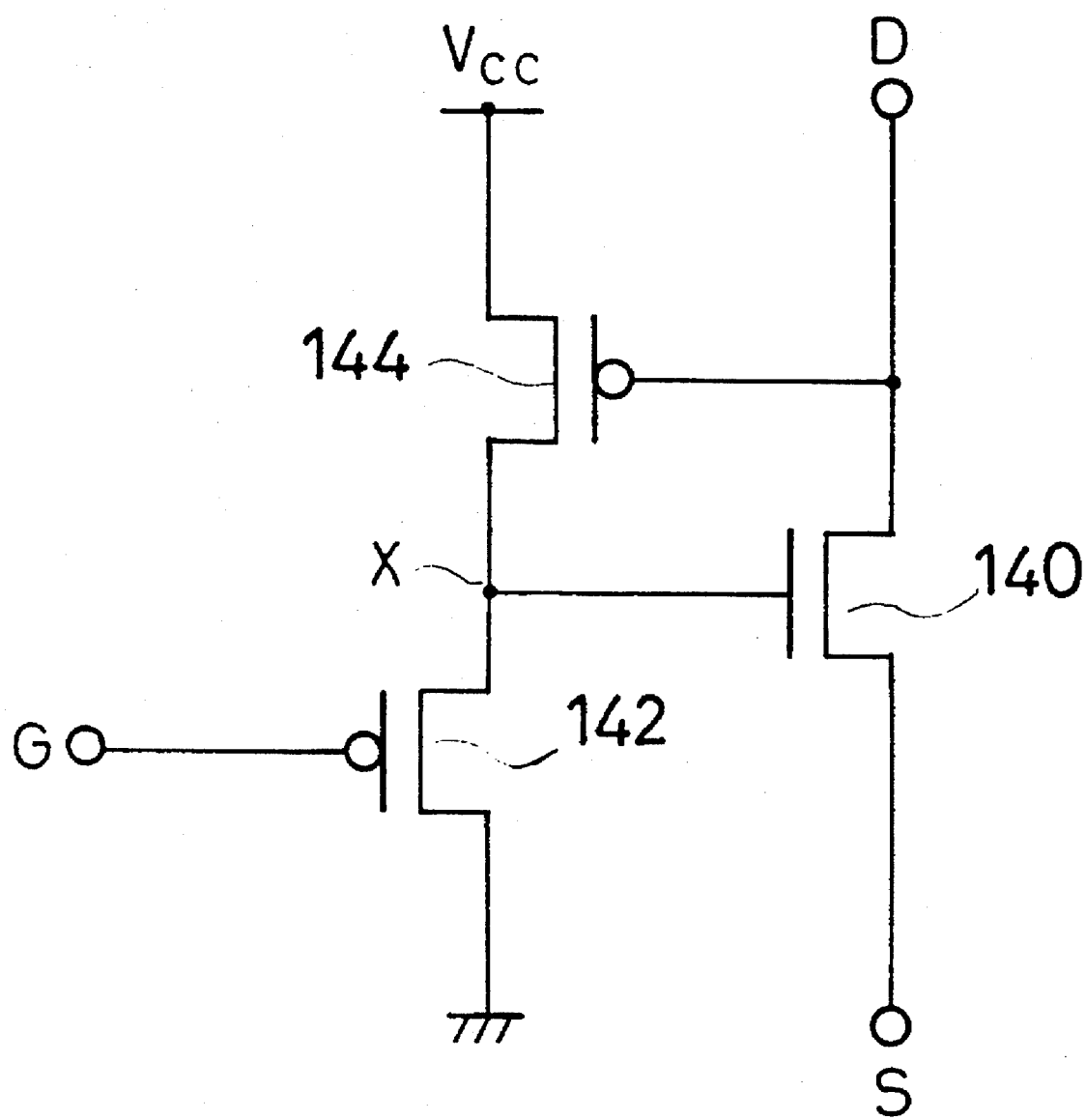
FIG. 24 is a schematic diagram of a novel negative-resistance circuit.

FIG. 24 shows a variation of the invented negative-resistance circuit in which the roles of P-MOSFET and N-MOSFET are interchanged. An N-MOSFET 140 is now coupled between the first and second input/output terminals S and D. Two P-MOSFETs 142 and 144 are coupled in series between $V_{CC}$ and ground. The gate of N-MOSFET 140 is coupled to internal node X, between P-MOSFETs 142 and 144. The gate of P-MOSFET 142 is coupled to control terminal G. The gate of P-MOSFET 144 is coupled to the second input/output terminal D.

Incidentally, terminals S, G, and D are analogous to the source, gate, and drain of a transistor. Terminals S and D are in fact the source and drain of N-MOSFET 140, while terminal G, via P-MOSFET 142, exerts control over the gate of N-MOSFET 140. Overall, the negative-resistance circuit operates much like a depletion-mode N-MOSFET, except that as the drain potential at terminal D rises, at a certain point the drain-source current, instead of merely saturating, starts to decline.

Figure 25:
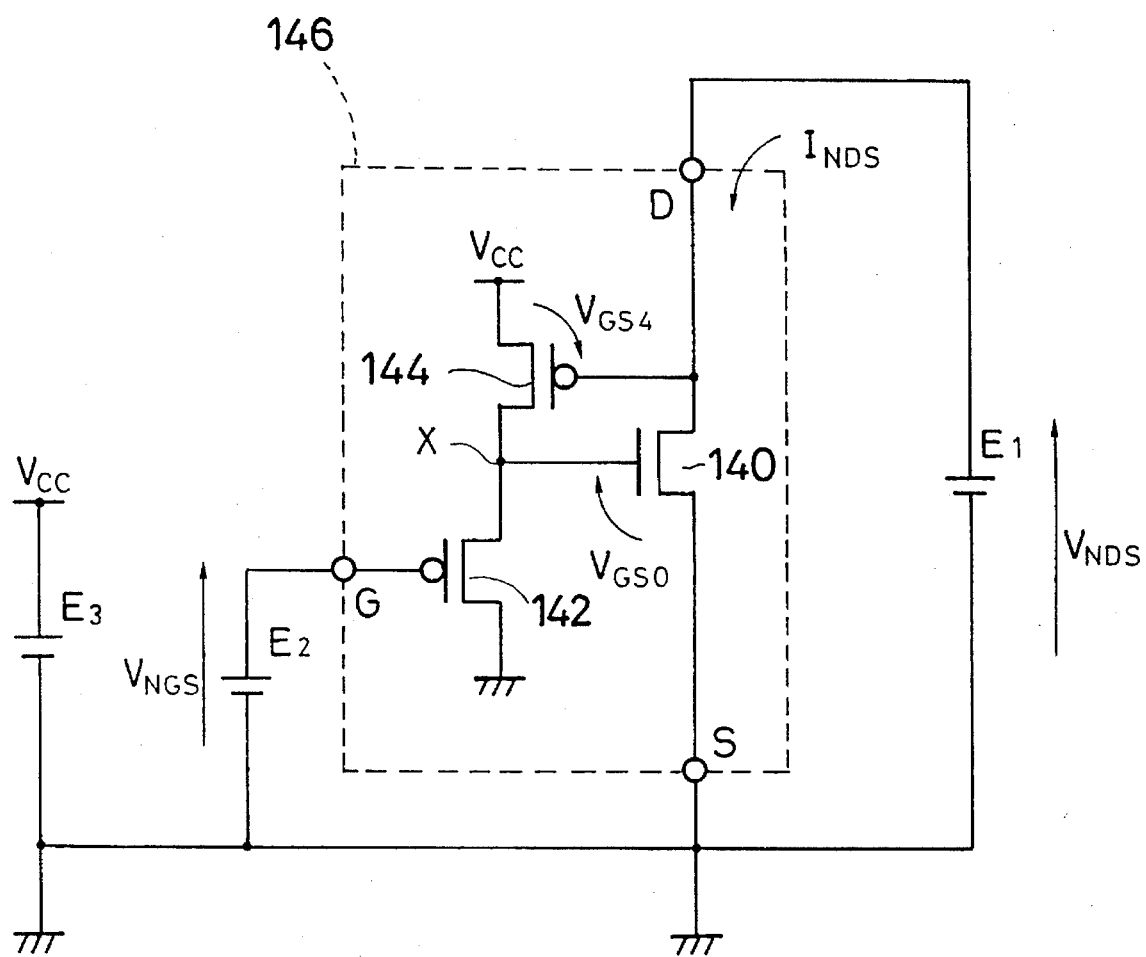
FIG. 25 is another schematic diagram of the novel negative-resistance circuit, illustrating currents and potentials.

FIG. 25 is an explanatory diagram of potentials and currents in this negative-resistance circuit. The static operation of this circuit can be described by assuming that input/output terminal S is grounded, and introducing three voltage sources $E_1$, $E_2$, and $E_3$. The first voltage source $E_1$ generates a voltage $V_{NDS}$ between the input/output terminals D and S. The second voltage source $E_2$ generates a voltage $V_{NGS}$ between control terminal G and input/output terminal S. The third voltage source $E_3$ provides the power-supply potential $V_{CC}$ applied to the source of P-MOSFET 144. $V_{GS0}$ denotes the gate-source voltage of N-MOSFET 140. The gate-source voltage of P-MOSFET 142 is $V_{NGS}$. The gate-source voltage of P-MOSFET 144 is $V_{NDS}-V_{CC}$, denoted $V_{GS4}$.

Figure 26:
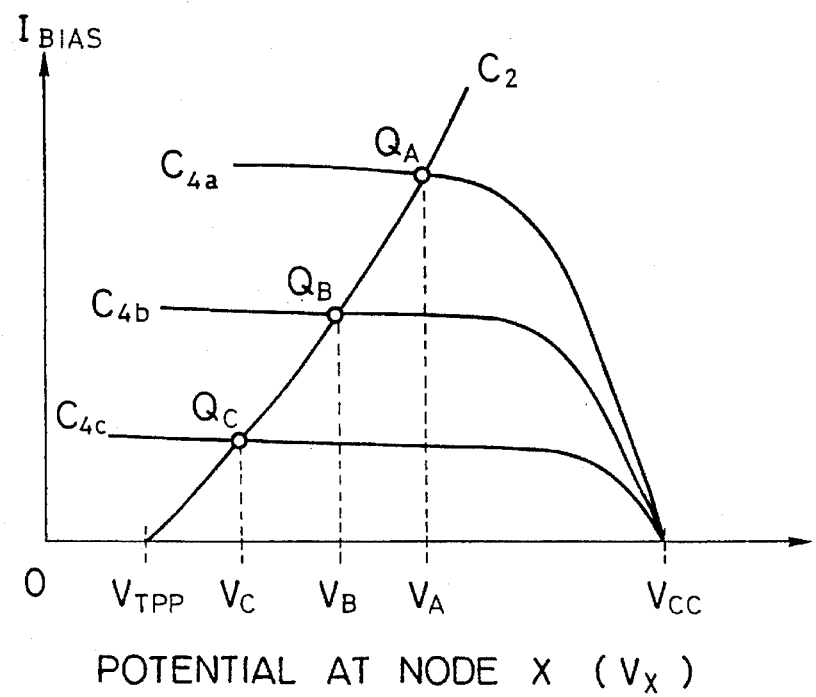
FIG. 26 illustrates volt-ampere characteristics of transistors in FIGS. 24 and 25.

FIG. 26 shows volt-ampere characteristics of P-MOSFETs 142 and 144 in FIG. 25 when $V_{NGS}$ is zero volts. The vertical axis indicates the current $I_{BIAS}$ flowing through P-MOSFETs 142 and 144; the horizontal axis indicates the potential $V_X$ of node X. Curve $C_2$ in FIG. 26 is the volt-ampere characteristic of P-MOSFET 142. Curves $C_{4a}$, $C_{4b}$, and $C_{4c}$ are volt-ampere characteristics of P-MOSFET 144 when $V_{NDS}$ has respective values of $V_a$, $V_b$, and $V_c$ (where $V_a < V_b < V_c$).

As potential $V_{NDS}$ increases from $V_a$ to $V_c$, the gate-source voltage $|V_{GS4}|$ of P-MOSFET 144 decreases, reducing the current flow through P-MOSFET 144. The operating point of node X when $V_{NDS}=V_a$ is the point $Q_A$, at which the potential $V_X$ of node X is $V_A$. Similarly, the operating point when $V_{NDS}=V_b$ is $Q_B$, at which $V_X=V_B$. The operating point when $V_{NDS}=V_c$ is $Q_C$, at which $V_X=V_C$. As $V_{NDS}$ increases from $V_a$ to $V_c$, the potential $V_X$ of node X decreases: $V_A > V_B > V_C$. The potential $V_X$ of node X is the gate-source voltage $V_{GS0}$ of N-MOSFET 140.

Figure 27:
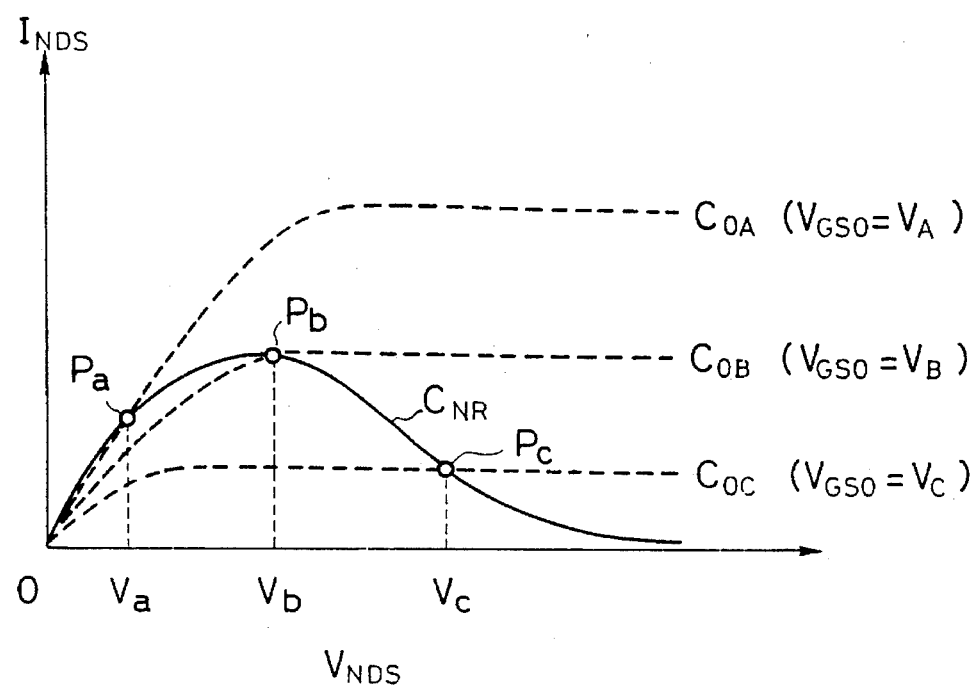
FIG. 27 illustrates a volt-ampere characteristic of the negative-resistance circuit in FIGS. 24 and 25.

FIG. 27 is a static characteristic diagram of the negative-resistance circuit 10 when $V_{NGS}$ is again zero volts. The vertical axis indicates the current $I_{NDS}$ flowing from input/output terminal D to input/output terminal S. The horizontal axis indicates the voltage $V_{NDS}$ between the input/output terminals D and S.

In FIG. 27, the solid-line curve $C_{NR}$ is the volt-ampere characteristic of the negative-resistance circuit 10. The dotted-line curves $C_{OA}$, $C_{OB}$, and $C_{OC}$ are the volt-ampere characteristics of N-MOSFET 140 when its gate-source voltage $V_{GS0}$ is fixed at $V_A$, $V_B$, and $V_C$, respectively. If $V_{NDS}$ is $V_a$, then $V_{GS0}$ is $V_A$, so curve $C_{OA}$ applies and the circuit operates at point $P_a$. If $V_{NDS}$ is $V_b$, then $V_{GS0}$ is $V_B$, so curve $C_{OB}$ applies and the circuit operates at point $P_b$. Similarly, if $V_{NDS}$ is $V_c$, then $V_{GS0}$ is $V_C$, so curve $C_{OC}$ applies and the circuit operates at point $P_c$.

When voltage $V_{NDS}$ is sufficiently small, i.e. $V_{NDS}=V_a$, the gate-source voltage $V_{GS0}$ of N-MOSFET 140 is sufficiently large that N-MOSFET 140 is in a non-saturated state in the vicinity of its operating point $P_a$. The current $I_{NDS}$ is therefore determined mainly by the voltage $V_{NDS}$, and as voltage $V_{NDS}$ increases, the current $I_{NDS}$ increases.

At a larger value of $V_{NDS}$, specifically at $V_{NDS}=V_b$, the gate-source voltage $V_{GS0}$ of N-MOSFET 140 becomes small enough that N-MOSFET 140 enters saturation, and the current $I_{NDS}$ peaks at operating point $P_b$.

If $V_{NDS}$ increases further, to $V_c$ for example, the gate-source voltage $V_{GS0}$ of N-MOSFET 140 decreases further and the N-MOSFET 140 becomes more deeply saturated. In the deeply saturated state around operating point $P_c$, current $I_{NDS}$ is determined mainly by the gate-source voltage $V_{GS0}$ of N-MOSFET 140, which is decreasing as $V_{NDS}$ increases. Accordingly, as voltage $V_{NDS}$ increases, current $I_{NDS}$ decreases, and a negative resistance characteristic is obtained.

When $V_{NDS}$ reaches $V_{CC}-V_{TP}$, P-MOSFET 144 turns off, $V_{GS0}$ holds steady at $V_{TPP}$, and curve $C_{NR}$ levels out parallel to the horizontal axis.

Figure 28:
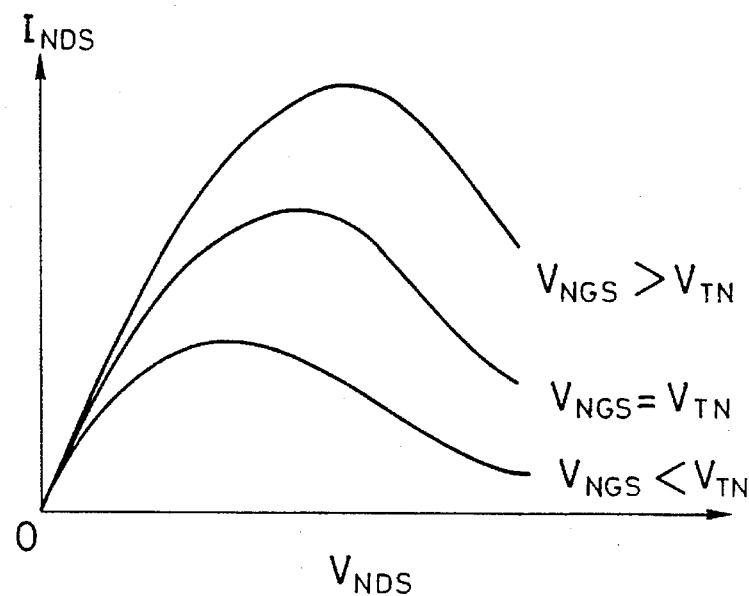
FIG. 28 illustrates further volt-ampere characteristics of the negative-resistance circuit in FIGS. 24 and 25.

FIG. 28 shows volt-ampere characteristics of the negative-resistance circuit 10 for three more values of $V_{NGS}$. As in FIG. 27, the vertical axis represents current $I_{NDS}$ and the horizontal axis represents voltage $V_{NDS}$. Curve $C_{NR1}$ applies when $V_{NGS}$ has a certain value between ground and $V_{TN}$. Curve $C_{NR2}$ applies when $V_{NGS}=V_{TN}$. Curve $C_{NR3}$ applies when $V_{NGS}$ has a certain value exceeding $V_{TN}$.

Referring again to FIG. 26, when voltage $V_{NGS}$ is greater than zero, the characteristic curve $C_2$ of P-MOSFET 142 is shifted to the right by an amount equal to $V_{NGS}$. Therefore, the values of the gate-source voltage $V_{GS0}$ of N-MOSFET 140 ($V_A$, $V_B$, $V_C$) corresponding to given values of its drain-source voltage $V_{NDS}$ ($V_a$, $V_b$, $V_c$) also shift to the right (increase).

In FIG. 28, this means that as $V_{NGS}$ rises, the increasing gate-source voltage of N-MOSFET 140 causes it to enter saturation at a later point, and causes overall current flow to rise. The characteristic curves therefore peak at higher values, with the peak occurring further to the right, a shown.

To summarize, for sufficiently large voltages between its input/output terminals S and D, the circuit in FIG. 24 shows negative resistance between these terminals, current flow decreasing as the voltage increases. The conductance of the negative-resistance circuit also varies with the potential of the control terminal G, the conductance increasing as the potential of terminal G increases.

A similar description applies to the negative-resistance circuits in FIGS. 10 to 22, with the roles of $V_{CC}$ and ground interchanged, so that conductance decreases as the potential of terminal G increases.

The invented negative-resistance circuit has several advantages. One is a simple configuration and easy fabrication, since it consists only of three enhancement-mode MOSFETs. Another is a high current-driving capability, because only a single MOSFET (N-MOSFET 140 in FIG. 24, P-MOSFET 54 in FIG. 10) is coupled in series between the input/output terminals S and D. Yet another advantage is that the gate bias of this MOSFET can be designed independently of its drain-source current $I_{NDS}$, by appropriate selection of the parameters of the other two MOSFETs (P-MOSFETs 142 and 144 in FIG. 24, N-MOSFETS 56 and 58 in FIG. 10). This affords a high degree of freedom in design, in particular with respect to differential volt-ampere characteristics (change in $I_{NDS}$ over change in $V_{NDS}$).

If necessary, depletion-mode MOSFETs can be used for one or more of the transistors in this negative-resistance circuit. Although there is a fabrication-cost penalty, this enables circuits with various useful characteristics to be designed. For example, if P-MOSFET 142 in FIG. 24 is of the depletion type, then the characteristic curves in FIG. 28 are shifted downward and the current $I_{NDS}$ can be made to cut off when $V_{NGS}$ is zero volts. A so-called enhancement-mode negative-resistance circuit can also be obtained easily.

14th Embodiment

Figure 29:
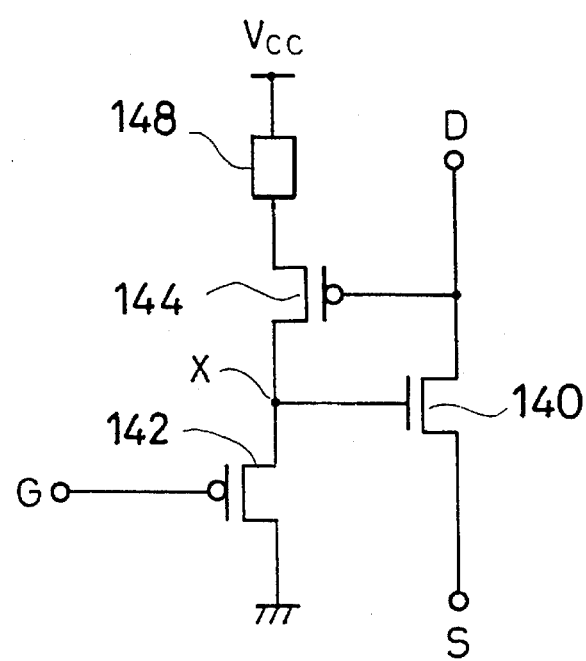
FIG. 29 illustrates a modification of the negative-resistance circuit in FIG. 24.

Referring to FIG. 29, a switch 148 can be added between P-MOSFET 144 and $V_{CC}$. When switch 148 is in the on-state, the negative-resistance circuit is enabled and operates as described above in FIGS. 24 to 28. When switch 148 is in the off-state, the negative-resistance circuit is disabled and bias current flow through P-MOSFETs 142 and 144 is cut off, reducing power dissipation.

Regardless of the potential of control terminal G, the potential of node X does not go below $|V_{TPP}|$. When node X is at this potential, $|V_{TPP}| \gg V_{TN}=V_{TP}$ (approximately), so N-MOSFET 140 is in the on-state even if switch 148 is in the off-state.

15th Embodiment

Figure 30:
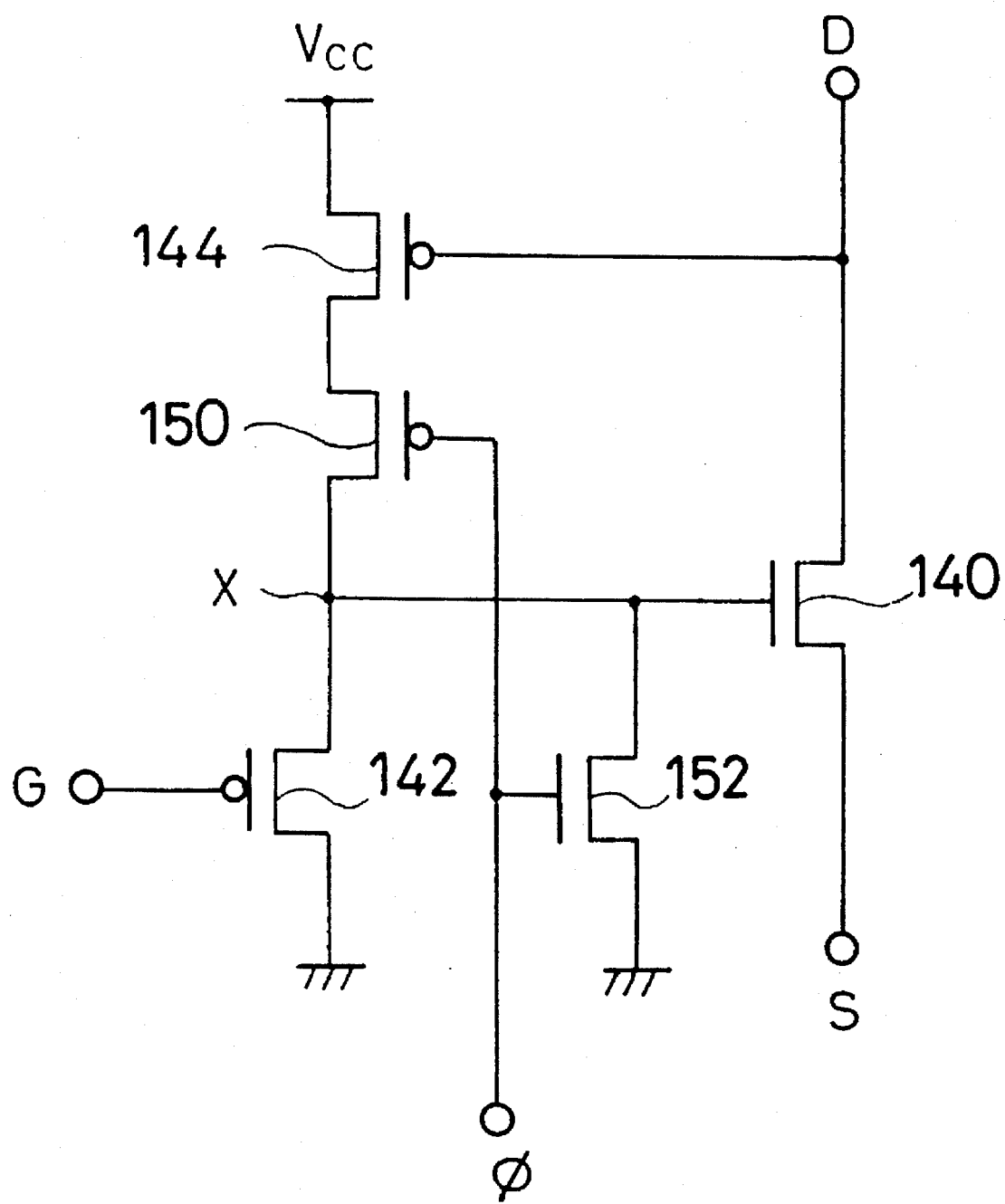
FIG. 30 illustrates another modification of the negative-resistance circuit in FIG. 24.

Referring to FIG. 30, the negative-resistance circuit in FIG. 24 can also be modified to have N-MOSFET 140 cut off when the circuit is disabled. In FIG. 30 a P-MOSFET 150 is coupled in series between node X and the drain of P-MOSFET 144, and an N-MOSFET 152 is coupled between node X and ground. The gates of both P-MOSFET 150 and N-MOSFET 152 are coupled to a terminal φ. P-MOSFET 150 and N-MOSFET 152 function as switches that switch the negative-resistance circuit on and off.

When terminal φ is high (at the $V_{CC}$ potential), P-MOSFET 150 is in the off-state and N-MOSFET 152 is in the on-state. The off-state of the P-MOSFET 150 cuts off the bias current flowing through P-MOSFETs 142 and 144. Since N-MOSFET 152 is switched on, node X is at ground potential, and N-MOSFET 140 is in the off-state. The negative-resistance circuit is completely disabled; no current flows through it, either between $V_{CC}$ and ground or between the input/output terminals D and S.

When terminal φ is low (at ground potential), P-MOSFET 150 is in the on-state and N-MOSFET 152 is in the off-state. The negative-resistance circuit now operates as in FIGS. 24 to 28. An advantage of the switching scheme in FIG. 30 is that it does not impair the current-driving capability of the circuit, because as before, only a single N-MOSFET 140 is coupled between the input/output terminals S and D.

16th Embodiment

Figure 31:
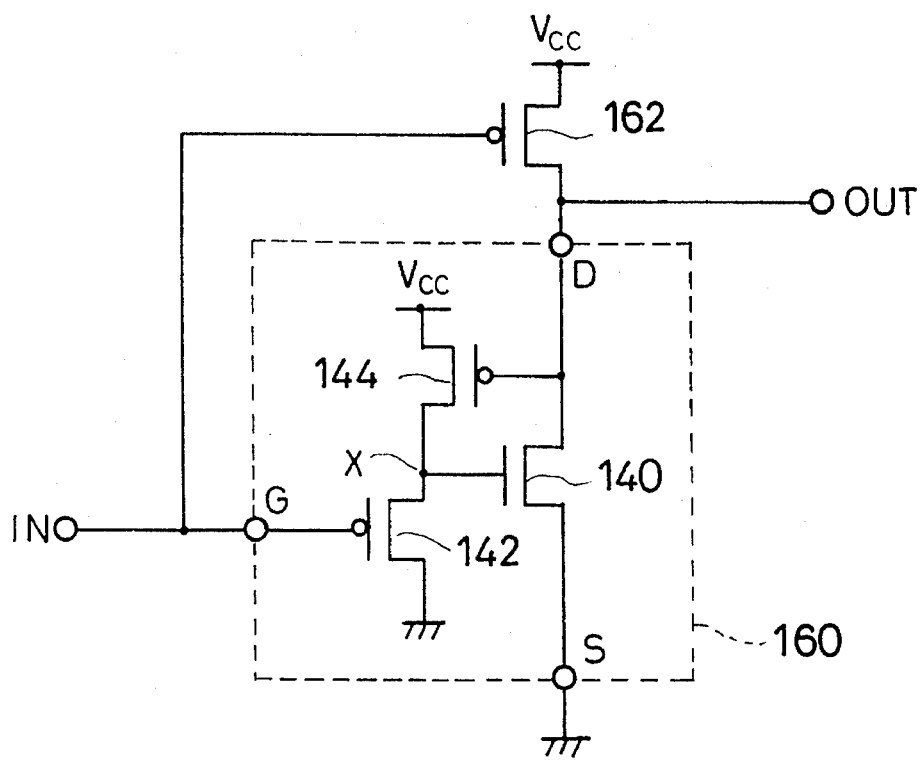
FIG. 31 is a schematic diagram of a Schmitt trigger incorporating the negative-resistance circuit of FIG. 24.

FIG. 31 illustrates an application of the invented negative-resistance circuit in a Schmitt trigger. The Schmitt trigger comprises the negative-resistance circuit 160 of FIG. 24 and a P-MOSFET 162. The first input/output terminal S of the negative-resistance circuit 160 is coupled to ground, and the control terminal G is coupled to an input terminal IN. The second input/output terminal D is coupled to an output terminal OUT and to the drain of P-MOSFET 162. The gate of P-MOSFET 162 is coupled to the input terminal IN, and its source is coupled to $V_{CC}$.

The operation of the Schmitt trigger in FIG. 31 will be described with reference to FIGS. 32 and 33.

Figure 32:
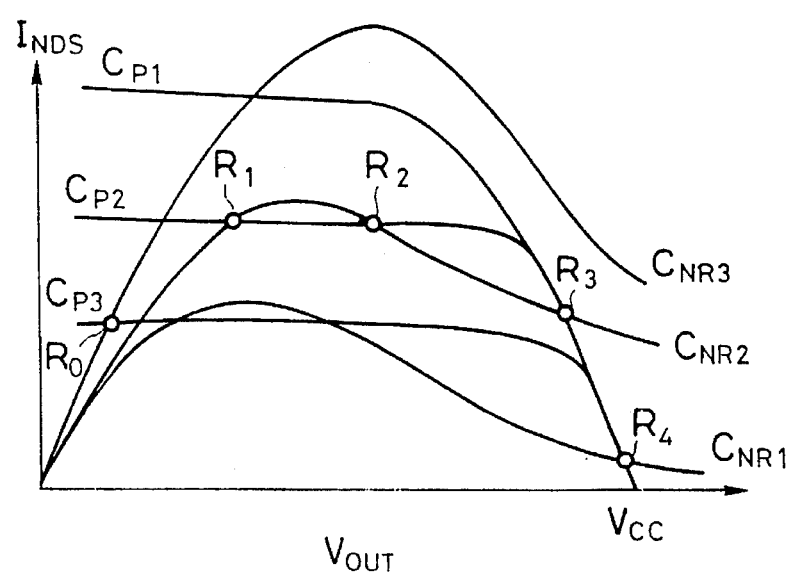
FIG. 32 illustrates volt-ampere characteristics of the Schmitt trigger in FIG. 31.

FIG. 32 shows volt-ampere characteristics of the negative-resistance circuit 160 and P-MOSFET 162. The vertical axis indicates the current $I_{NDS}$ flowing from $V_{CC}$ to ground through P-MOSFET 162, input/output terminal D, and input/output terminal S. The horizontal axis indicates the potential $V_{OUT}$ of the output terminal OUT, which is also the voltage $V_{NDS}$ applied between input/output terminals D and S.

Curves $C_{NR1}$, $C_{NR2}$, and $C_{NR3}$ are volt-ampere characteristics of the negative-resistance circuit 160 for three increasing values of the potential at input terminal IN, similar to the three curves shown in FIG. 28. Curves $C_{P1}$, $C_{P2}$, and $C_{P3}$ are corresponding characteristic curves of P-MOSFET 162. As the potential of input terminal IN rises, for a given value of $V_{OUT}$, more current flows through the negative-resistance circuit 160, and less current flows through P-MOSFET 162.

Curves $C_{NR3}$ and $C_{P3}$ intersect at a single point $R_0$. Curves $C_{NR2}$ and $C_{P2}$ intersect at multiple points $R_1$, $R_2$, and $R_3$. Curves $C_{NR1}$ and $C_{P1}$ intersect at a single point $R_4$.

As the potential at input terminal IN falls from $V_{CC}$, for example, the Schmitt trigger operates first at point $R_0$, then at point $R_1$. In both cases the output potential $V_{OUT}$ is low. As the potential at input terminal IN falls further, operating points such as $R_0$, $R_1$, and $R_2$ disappear and the circuit is constrained to operate around point $R_4$, so $V_{OUT}$ goes high. If the potential at input terminal IN rises again, the circuit returns from point $R_4$ to $R_3$, instead of to $R_1$. $V_{OUT}$ remains high. When the potential at input terminal IN rises still further, however, operating points such as $R_3$ and $R_4$ disappear, and the circuit is constrained to operate around $R_0$; $V_{OUT}$ goes low.

Figure 33:
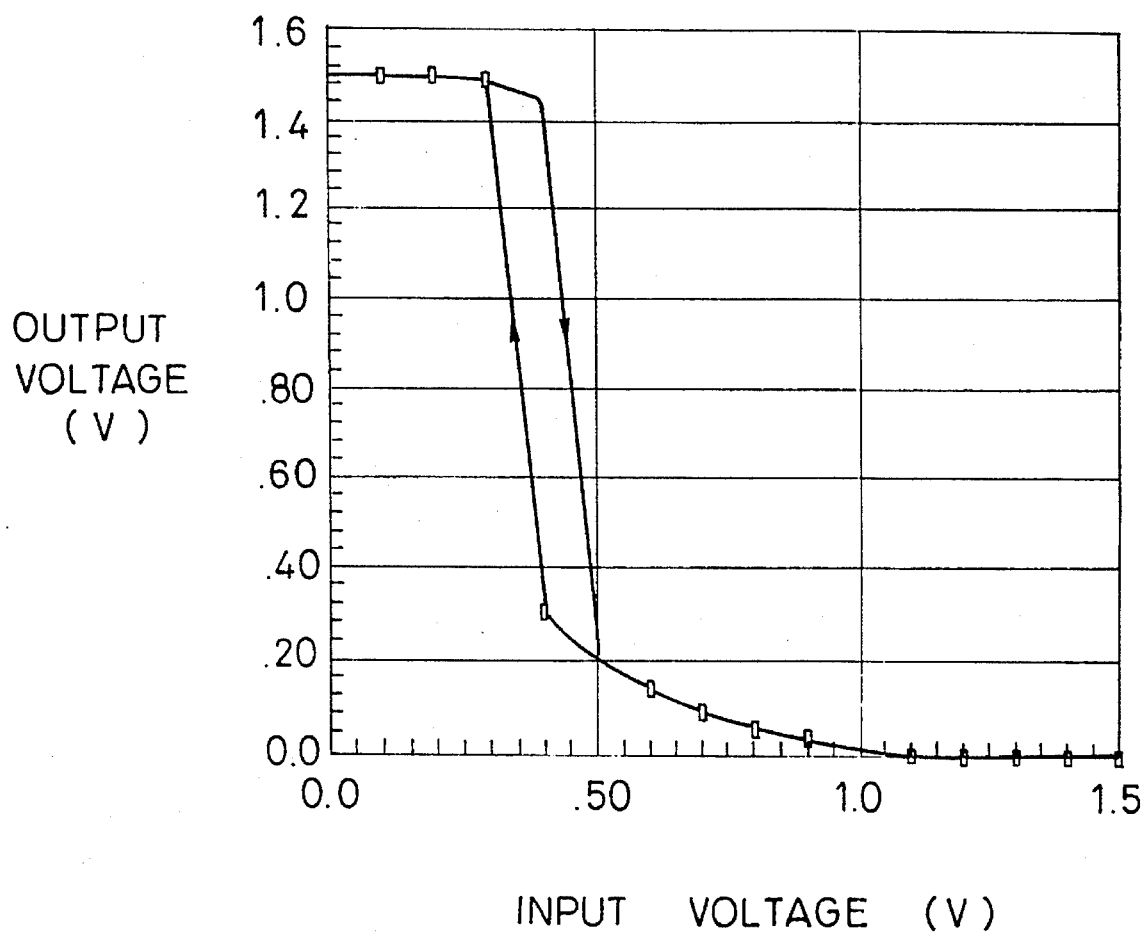
FIG. 33 illustrates a hysteresis characteristic of the Schmitt trigger in FIG. 31.

The Schmitt trigger in FIG. 31 accordingly operates with a hysteresis characteristic as shown in FIG. 33. The vertical axis in FIG. 33 indicates the potential $V_{OUT}$ at the output terminal OUT. The horizontal axis indicates the potential at the input terminal IN. The output voltage switches between zero volts and about 1.5 volts. The switching point occurs at input potentials of about 0.35 and 0.45 volts: at 0.45 volts when the input potential is rising, and at 0.35 volts when the input potential is falling.

This Schmitt trigger has the advantage of a low fabrication cost, because it uses only enhancement-mode transistors. It can also be designed for low power dissipation, as described next.

In the Schmitt trigger of FIG. 31, when the potential of the input terminal IN is $V_{CC}$, P-MOSFET 162 is in the off-state, so current flow between the input/output terminals D and S in the negative-resistance circuit 160 is cut off. When the input terminal IN is at ground potential, this current flow is not cut off, but it can be reduced by coupling the substrate potential of P-MOSFET 142 in the negative-resistance circuit 160 to node X, for example, so that node X operates near $|V_{TP}|$.

Bias current will still flow through P-MOSFETs 142 and 144 in the negative-resistance circuit 160, but since these P-MOSFETs 142 and 144 do not directly drive the input/output terminals, they do not need a high current-handling capability. The bias current flow can accordingly be reduced by designing P-MOSFETs 142 and 144 to have a high on-state resistance.

Depletion-mode MOS transistors can also be employed in FIGS. 29, 30, or 31 to obtain characteristics not found in the prior art.

Modifications

This invention is not restricted to the above embodiments, but allows various modifications such as, for example, the following.

Circuits with similar effects are obtained if N-MOSFET is replaced by P-MOSFET, P-MOSFET by N-MOSFET, $V_{CC}$ by ground, and ground by $V_{CC}$ in any of the preceding embodiments.

Current consumption in the circuits of FIGS. 2 to 17, FIGS. 20 and 21, and FIG. 31 can be reduced by inserting switching transistors or other switching means to cut off current flow in the disabled state, as shown in FIGS. 19, 22, 23, 29, and 30. In FIGS. 2 to 22, another possibility is to switch off the load circuit in the disabled state, and provide other means for biasing the input terminals or their connected data lines in this state.

Those skilled in the art will recognize that further modifications can be made without departing from the scope of the invention as claimed below.

What is claimed is:

1. A load circuit, comprising:

an input terminal;

a field-effect transistor with a source coupled to receive a fixed potential, a gate, and a drain coupled to said input terminal; and a level shifter coupled between said input terminal and the gate of said field-effect transistor, for shifting a potential of said input terminal, thereby controlling said field-effect transistor.

2. The load circuit of claim 1, wherein said level shifter shifts the potential of said input terminal by at east an amount equal to a threshold voltage of said field-effect transistor.

3. The load circuit of claim 1, wherein said input terminal is coupled to a data line in a memory circuit.

* * * * *